(12) United States Patent
Dodiya et al.

(10) Patent No.: US 12,640,718 B1
(45) Date of Patent: May 26, 2026

(54) GLITCH-FREE DELAY LINE ARCHITECTURE

(71) Applicant: Cadence Design Systems, Inc., San Jose, CA (US)

(72) Inventors: Parth Manishbhai Dodiya, Bangalore (IN); Jitendra Kumar Yadav, Bengaluru Karnataka (IN); Sachin Ramesh Gugwad, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 42 days.

(21) Appl. No.: 18/736,726

(22) Filed: Jun. 7, 2024

(51) Int. Cl.
| | |
|---|---|
| *H03K 5/134* | (2014.01) |
| *H03K 5/135* | (2006.01) |
| *H03L 7/081* | (2006.01) |
| *G11C 11/4076* | (2006.01) |
| *H03K 5/00* | (2006.01) |

(52) U.S. Cl.
CPC ............. *H03K 5/134* (2014.07); *H03K 5/135* (2013.01); *H03L 7/0818* (2013.01); *G11C 11/4076* (2013.01); *H03K 2005/00195* (2013.01)

(58) Field of Classification Search
CPC .................. H03K 5/134; H03K 5/135; H03K 2005/00195; H03K 5/133; H03K 5/14; H03K 2005/00013; H03K 2005/0015; H03K 2005/00234; H03K 5/159; H03L 7/0818; G11C 11/4076
See application file for complete search history.

(56) References Cited

U.S. PATENT DOCUMENTS 6,288,587 B1 * 9/2001 Chen ...................... H03K 5/159
327/261

* cited by examiner

*Primary Examiner* — Jung Kim
(74) *Attorney, Agent, or Firm* — Mark H. Whittenberger; Holland & Knight LLP

(57) ABSTRACT

Dynamically updating a delay line code. A circuit for updating a delay line code is provided having a delay line having a first chain of interleaved logic gates and a second chain of interleaved logic gates. The circuit further include a first clock path generated based upon the first chain of interleaved logic gates and a second clock path generated based upon the second chain of interleaved logic gates, wherein an output of at least one logic gate is forced to zero prior to performing a code update.

10 Claims, 32 Drawing Sheets

400

DQS strobe input 402

410
Coarse delay line

Coarse delay code
404

C_EVEN
406

C_ODD
408

420
DL Cell

Fine delay code
422

DQS strobe delayed output
424

420

DL cell (Fine delay element)

output

C_EVEN

C_ODD

| | | | | | | | |
|---|---|---|---|---|---|---|---|
| 1,2 | 0 | 0 | 0 | 0 | 0 | 0 | 1 |
| 2,3 | 0 | 0 | 0 | 0 | 0 | 0 | 1 |
| 3,4 | 0 | 0 | 0 | 0 | 0 | 1 | 1 |
| 4,5 | 0 | 0 | 0 | 0 | 1 | 1 | 1 |
| 5,6 | 0 | 0 | 0 | 1 | 1 | 1 | 1 |
| 6,7 | 0 | 0 | 1 | 1 | 1 | 1 | 1 |
| 7,8 | 0 | 1 | 1 | 1 | 1 | 1 | 1 |

| Coarse Delay line code | Fine delay line code Min to Max |
|---|---|
| 1 | 0 to 8 |
| 2 | 8 to 0 |
| 3 | 0 to 8 |
| 4 | 8 to 0 |
| 5 | 0 to 8 |
| 6 | 8 to 0 |
| ... | ... |

1600

/CLK_OUT

/CLK_IN

/CODESTEP

1900

OLD Course Code 3 : 0000 0000 0000 0111

When CLK_GATING is HIGH. TOGGLE is forced to 0.

New Code 0L: 0000 1111 1111 1111

2300

2500

EN_PLUS_2

EN

CLK_GATE_BAR

EN_CLKIN

EN_CLK_NXT

| CLK_GATE_BAR | EN+2 | EN | EN_CLKIN | EN_CLK_NEXT |
|---|---|---|---|---|
| 0 | 0 | 0 | 1 | 0 |
| 0 | 0 | 1 | 1 | 0 |
| 0 | 1 | 0 | X | X |
| 0 | 1 | 1 | 0 | 1 |
| 1 | 0 | 0 | 0 | 1 |
| 1 | 0 | 1 | 1 | 0 |
| 1 | 1 | 0 | X | X |
| 1 | 1 | 1 | 0 | 1 |

2900

Step1 Normal Operation on OLD RANK
Code 3 : 0000 0000 0000 0111

Step2 Enable BYPASS --
OLD RANK Code 3 : 0000 0000 0000 0111
Actual code seen by DL : 0000 0000 0000 0110

Step3 Update Code
New RANK DL: 0000 1111 1111 1111
Actual code seen by DL : 0000 1111 1111 1110

Step4 Normal Operation on NEW RANK
New RANK DL: 0000 1111 1111 1111

GLITCH-FREE DELAY LINE ARCHITECTURE

FIELD OF THE INVENTION

Embodiments of the present disclosure relate to use of delay lines in memory interfaces and, more particularly, to dynamically updating a delay line code used in the memory interfaces.

BACKGROUND

Memory modules may use clocking schemes to interface with other system components. The clocking schemes may use delay lines to align various read and write signals. For example, a data signal (DQ) may be a data line that transfers bits on leading edges and falling edges of a clock signal. Further, a clock strobe or data strobe (DQS) may be the clock signal for the data line. A delay line scheme may be used to align the clock strobe DQS with the data signal DQ. The delay line scheme may have an associated delay line code.

SUMMARY

Accordingly, a method for updating a delay line code is provided. The method may include receiving a strobe input at a delay line and receiving a delay cell code at the delay line. The method may further include generating a first clock path based upon a first chain of interleaved logic gates included within the delay line. The method may also include generating a second clock path based upon a second chain of interleaved logic gates included within the delay line, wherein an output of at least one logic gate is forced to zero prior to performing a code update.

One or more of the following features may be included. In some embodiments, the delay line may include a plurality of delay cells associated with the first clock path. The delay line may include a plurality of delay cells associated with the second clock path. Each of the plurality of delay cells may include a plurality of NAND gates. The output of the at least one logic gate may be forced to zero by providing a zero as an input to a single logic gate of the at least one logic gate. The code update may be performed using a glided mode or a non-glided mode. The delay line may be bypassed when a rank switch request is asserted. The delay line may be a coarse delay line or a fine delay line. A fine delay cell code may be switched after a coarse delay cell code is switched.

In another embodiment of the present disclosure, a circuit for dynamically updating a delay line code is provided. A circuit for updating a delay line code is provided having a delay line having a first chain of interleaved logic gates and a second chain of interleaved logic gates. The circuit further include a first clock path generated based upon the first chain of interleaved logic gates and a second clock path generated based upon the second chain of interleaved logic gates, wherein an output of at least one logic gate is forced to zero prior to performing a code update.

One or more of the following features may be included. In some embodiments, the delay line may include a plurality of delay cells associated with the first clock path. The delay line may include a plurality of delay cells associated with the second clock path. Each of the plurality of delay cells may include a plurality of NAND gates. The output of the at least one logic gate may be forced to zero by providing a zero as an input to a single logic gate of the at least one logic gate. The code update may be performed using a glided mode or a non-glided mode. The delay line may be bypassed when a rank switch request is asserted. The delay line may be a coarse delay line or a fine delay line. A fine delay cell code may be switched after a coarse delay cell code is switched.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 7A is a table illustrating an example delay line encoding according to an embodiment of the present disclosure;

FIG. 7B is a table illustrating example thermometric code according to an embodiment of the present disclosure;

DETAILED DESCRIPTION

Figure 1:
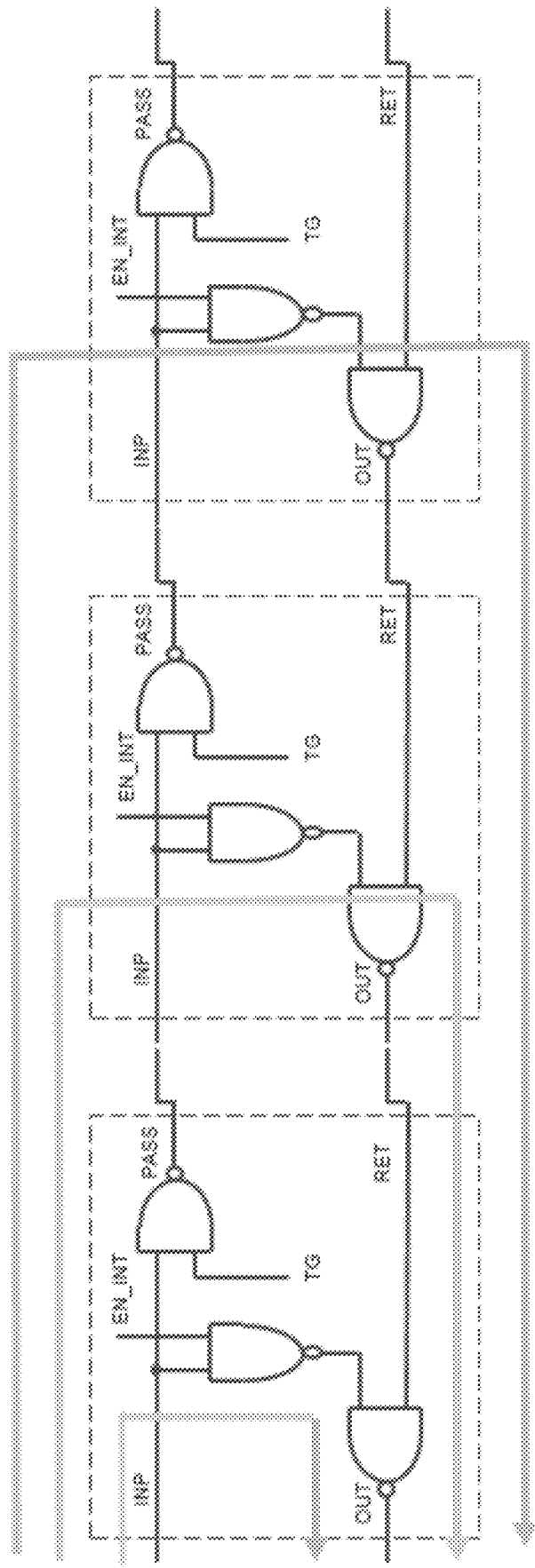
FIG. 1 is a diagram showing an example coarse delay line structure.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings denote like elements.

Memory interfaces such as low-power double data rate 5 (LPDDR5) interfaces may be used widely in consumer applications and devices such as mobile phones and laptops. Such applications may demand a relatively small footprint for an integrated circuit (IC) chip on a printed circuit board (PCB) of a device. Thus, it may be desirable to reduce area and power usage for memory interfaces (e.g., LPDDR5 interfaces) to make them more competitive in the market.

A clocking scheme for memory interfaces (e.g., LPDDR5 interfaces or double data rate 5 (DDR5) interfaces) may use delay lines to align a clock strobe (DQS or clock signal or strobe signal) with a data signal DQ on a read side and a write side of an interface between a system-on-a-chip (SOC) and a memory. The delay lines may be trained and/or aligned during initialization. Delay line codes may be calibrated during initialization to align the data signal and the strobe signal for better sampling of the data signal by the strobe signal. Time may cause the delay of the delay line to change as voltage and temperature conditions change. A periodic update scheme which may update the delay line code may keep the delay constant with the change in the voltage and the temperature. In other words, after initialization, the delay line may have a drift in delay caused by changing voltage and temperature which may need to be corrected periodically by updating the delay line code. Thus, in order to track the voltage-temperature (VT) drift of the delay line delay, an update mechanism may be needed to update the delay line code periodically.

Some mechanisms used to update the delay line code may introduce problems (e.g., glitches) in the clock strobe (DQS or clock signal) when the delay line code is updated. For example, existing schemes for updating the delay line code may cause a glitch on an output when the delay line code is updated. The glitch may issue a false strobe clock edge and corrupt data being read from or written to the memory.

Such problems may not be optimal for on-the-fly, dynamic updating of the delay line code and may require complicated clock gating and sequencing operations in the physical layer (PHY) with a memory controller to ensure that data is not exchanged between the SOC and the memory during the updating of the delay line code. For example, the clock gating and sequencing operations may increase the area and complexity of the PHY Further, preventing transfer of data during the delay line code update operation may reduce the bandwidth of the system. As such, there may be a need for a streamlined, on-the-fly, dynamic updating scheme to update the delay line code without causing such problems in the delay line output. The techniques and features described by the present disclosure may simplify the PHY and save area and power spent on clock gating and sequencing operations previously required.

Referring to FIG. 1, an example coarse delay line structure for a memory is shown. Coarse delay line 100 may incorporate a trombone structure and may include delay cells with NAND gates that form a delay line. Control signals EN_INT, RET, and TG may be switched to add successive coarse delay elements in the delay line and ultimately increase the delay. For example, each successive coarse delay element may add a delay corresponding to two NAND gates in the delay line.

Figure 2:
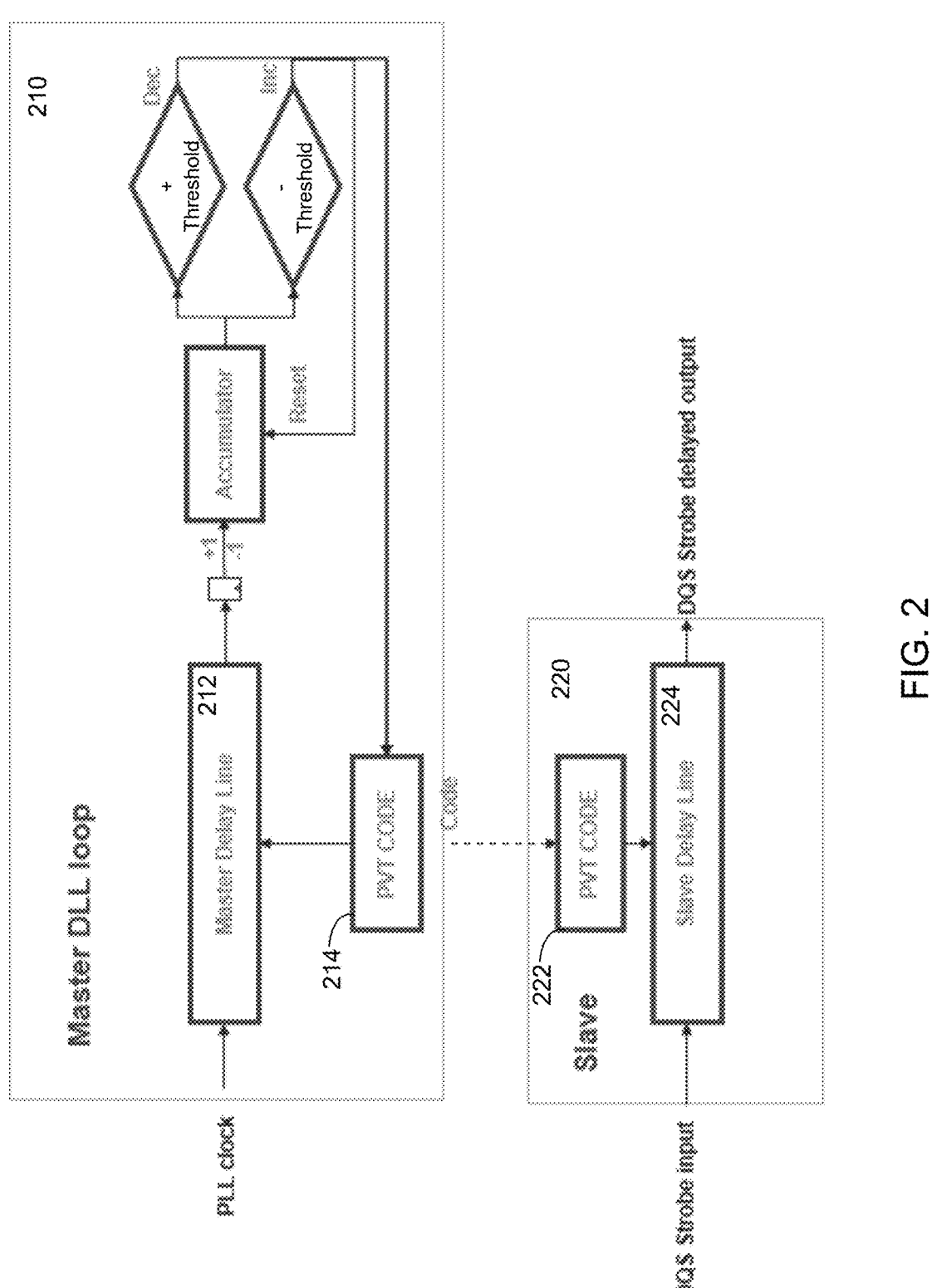
FIG. 2 is a diagram showing an example delay-locked loop architecture.

Referring to FIG. 2, an example delay-locked loop (DLL) architecture is shown. DLL 200 may include a master DLL loop 210 and a slave 220 with a strobe (DQS) input and a strobe (DQS) delayed output. FIG. 2 illustrates an example scheme that may be used to keep the delay of the delay line constant. The master DLL loop 210 may include a master delay line 212 which may run in a loop to calibrate the master delay line 212 to a fixed delay (for e.g., two bit periods or unit intervals (UI)). The delay line code (e.g., process, voltage, and temperature (PVT) code 214) of the master delay line 212 may be continuously being updated to keep the delay fixed. The delay line code (e.g., PVT code 214) of the master delay line 212 may be compared with the slave delay line 224 and the PVT code 222 of the slave 220 may be updated to keep the delay constant with time.

Figure 3:
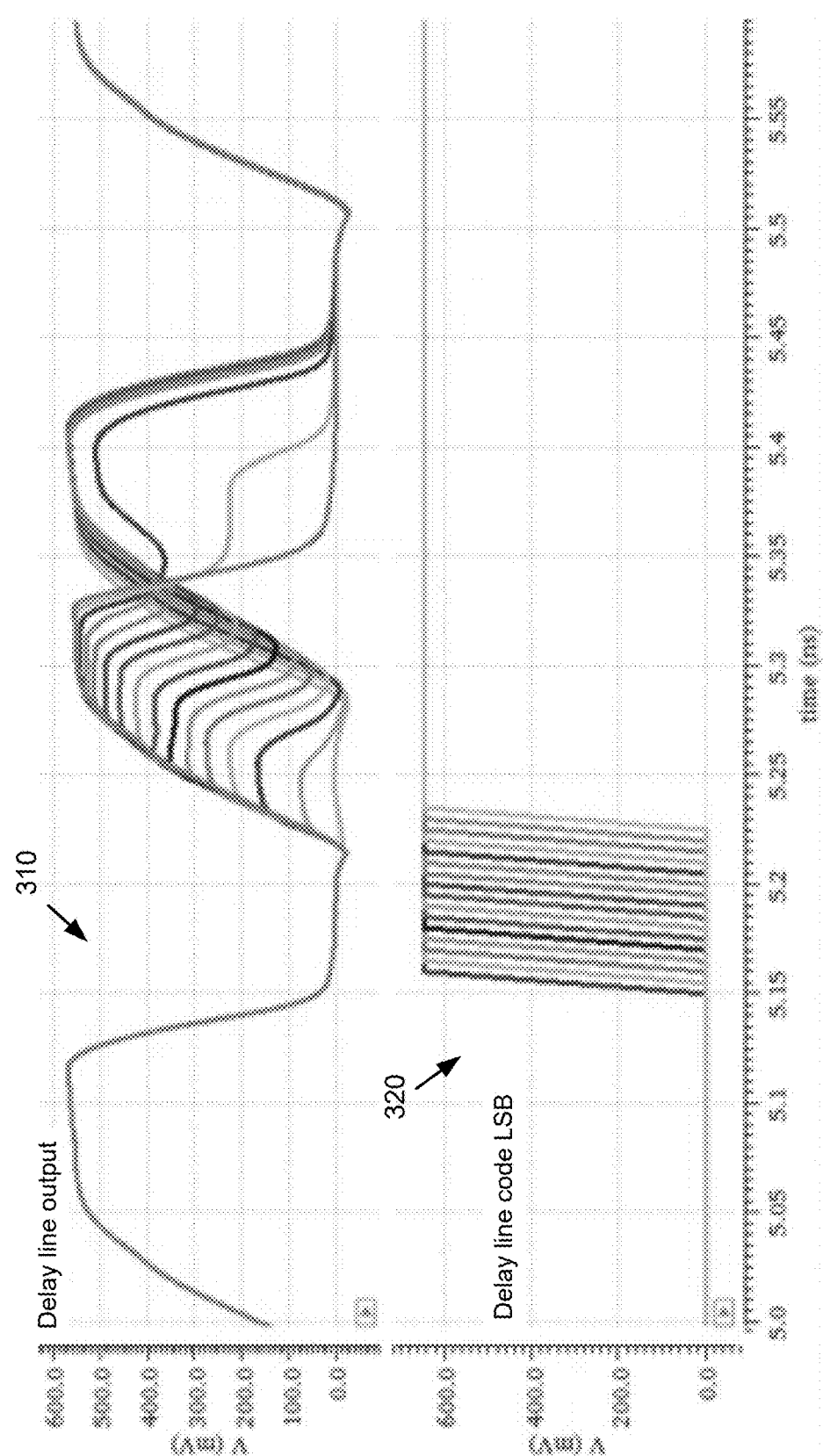
FIG. 3 is a graph showing an example delay line output.

Referring to FIG. 3, a graph showing an example delay line output is shown. Graph 300 shows a delay line output 310 as a delay line code least-significant bit (LSB) 320 is switched. A switching position of the delay line code may be swept in time with respect to the strobe (DQS). As shown in graph 300, a glitch in the delay line output 310 may occur when switching the delay line code. The glitch may create extra strobe (DQS) clock edges and may corrupt data transfer associated with the memory. As will be described below, the techniques and features of the present disclosure may provide a glitch-free delay line output.

Figure 4:
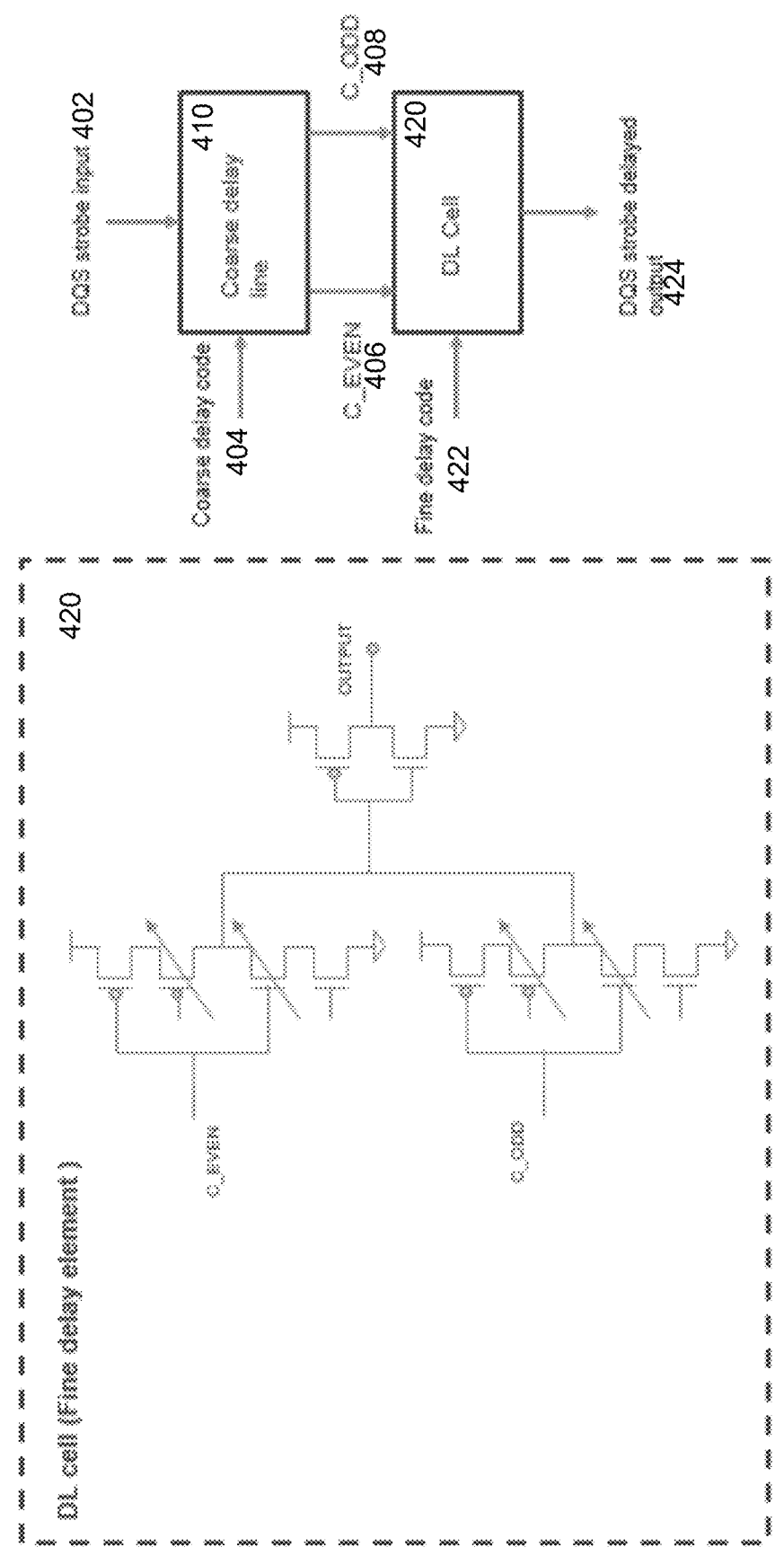
FIG. 4 is a diagram showing an example circuit according to an embodiment of the present disclosure.

Referring to FIG. 4, in some embodiments, a circuit 400 for updating a delay line code may include a coarse delay line 410 having a first chain of interleaved logic gates and a second chain of interleaved logic gates. The coarse delay line 410 may be configured to receive a strobe input 402 and a coarse delay cell code 404. The circuit may further include a first clock path 406 (e.g., from a clock C_EVEN) generated based upon the first chain of interleaved logic gates The circuit may also include a second clock path 408 (e.g., from a clock C_ODD) generated based upon the second chain of interleaved logic gates. The circuit may additionally include a fine delay cell 420 in electronic communication with the coarse delay cell 410. The fine delay cell 420 (also called DL cell or fine delay element) may be configured to receive the first clock path 406, the second clock path 408, and a fine delay cell code 422. The circuit may further include a strobe (DQS) delayed output 424 generated based upon, at least in part, the first clock path 406, the second clock path 408, and the fine delay code 422.

Figure 5:
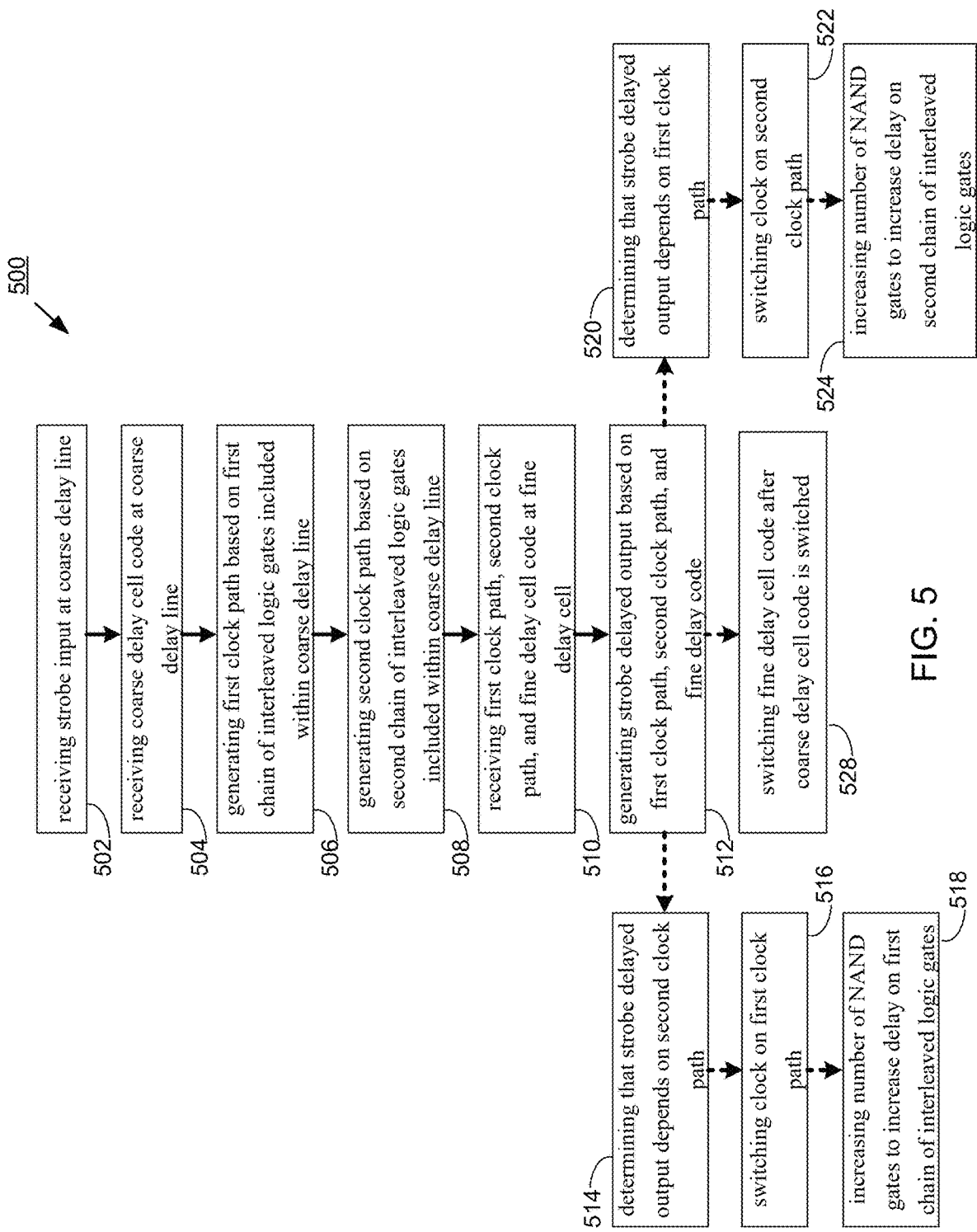
FIG. 5 is a flowchart showing an example process for updating a delay line code according to an embodiment of the present disclosure.

Referring to FIG. 5, in some embodiments, a method 500 for updating a delay line code may include receiving 502 the strobe input 402 at the coarse delay line 410. The method 500 may further include receiving 504 the coarse delay cell code 404 at the coarse delay line 410. The method 500 may also include generating 506 the first clock path 406 (e.g., from the clock C_EVEN) based upon a first chain of interleaved logic gates included within the coarse delay line 410. The method 500 may additionally include generating 508 a second clock path 408 (e.g., from the clock C_ODD) based upon a second chain of interleaved logic gates included within the coarse delay line 410. In other words, in some embodiments, two intermediate clocks C_EVEN and C_ODD may be generated by one or more interleaved chains of logic gates. The logic gates may be interleaved in a manner that increases a delay in coarse steps of a fixed number of logic gates such as NAND gates (e.g., two NAND gates for each increment in the coarse delay line code). Thus, the coarse delay line 410 may include a plurality of delay cells associated with the first clock path 406 and/or the second clock path 408.

The method 500 may further include receiving 510 the first clock path 406, the second clock path 408, and the fine delay cell code 422 at the fine delay cell 420. The method 500 may also include generating 512 the strobe delayed output 424 based upon, at least in part, the first clock path 408, and the second clock path 408, and the fine delay code 422. In other words the final output of the delay line (e.g., the strobe delayed output 424) may be generated by interpolating the two input clocks C_EVEN and C_ODD using a fine interpolation delay cell (e.g., fine delay cell 420). The two clocks C_EVEN and C_ODD may be spaced apart by a fixed number of logic gates (e.g., two NAND gates). In other words, in some embodiments, the coarse delay line 410 may include a plurality of delay cells associated with the first clock path and/or the second clock path and each of the plurality of delay cells may include a plurality of logic gates such as NAND gates.

As will be discussed further below, both the coarse delay code 404 and the fine delay (cell) code 422 may be switched. In some embodiments, when the coarse delay code 404 is switched, the fine delay cell output (e.g., the strobe delayed output 424) may depend on only one of the two inputs clocks C_EVEN or C_ODD. In other words, the fine delay cell output (e.g., the strobe delayed output 424) may depend on only one of the first clock path 406 and the second clock path 408 when switching the coarse delay code 404.

In some embodiments, the method 500 may include determining 514 that the strobe delayed output 424 depends on the second clock path 408 (e.g., from the clock C_ODD). The method 500 may further include, based at least in part on determining that the strobe delayed output 424 depends on the second clock path 408, switching 516 the clock on the first clock path 506. When the fine delay cell output (e.g., the strobe delayed output 424) depends on the clock C_ODD, the clock C_EVEN may be switched. Further, the method 500 may include, based at least in part on determining that the strobe delayed output 424 depends on the second clock path 408, increasing 518 a number of logic gates such as NAND gates to increase the delay on the chain of logic gates for the clock C_EVEN. In other words, if the strobe delayed output 424 depends on the second clock path 408, the clock C_EVEN on the first clock path 406 may be switched and the number of logic gates such as NAND gates may be increased to increase the delay on the first chain of interleaved logic gates. In this case, because the output of the delay line depends on the clock C_ODD, switching the clock C_EVEN may not generate a glitch on the delay line output.

Further, in some embodiments, the method 500 may include determining 520 that the strobe delayed output 424 depends on the first clock path 406 (e.g., from the clock C_EVEN). The method 500 may also include, based at least in part on determining that the strobe delayed output 424 depends on the first clock path 406, switching 522 the clock on the second clock path 408. When the fine delay cell output (e.g., the strobe delayed output 424) depends on the clock C_EVEN, the clock on C_ODD may be switched. Further, the method 500 may include, based at least in part on determining that the strobe delayed output 424 depends on the first clock path 406, increasing 524 a number of logic gates such as NAND gates to increase the delay on the chain of logic gates for the clock C_ODD. In other words, if the strobe delayed output 424 depends on the first clock path 406, the clock C_ODD on the second clock path may be switched and a number of logic gates such as NAND gates may be increased to increase a delay on the second chain of interleaved logic gates. In this case, because the output of the delay line depends on the clock C_EVEN, switching the clock C_ODD may not generate a glitch on the delay line output.

Additionally, in some embodiments, the method 500 may include switching 528 the fine delay cell code after the coarse delay cell code is switched. The fine delay codes may be switched one code at a time or simultaneously (e.g., at about or near the same time). Because a time gap between two fine delay codes may be relatively low, switching the fine delay codes simultaneously may not cause glitch.

On-the-fly switching of delay lines may be enabled by generating the two outputs C_EVEN and C_ODD (e.g., by the coarse delay line). The two clocks C_EVEN and C_ODD may be spaced apart by a fixed number of logic gates such as NAND gates (e.g., two NAND gates). As shown in FIG. 4, the final delay line output may be generated by providing the two clocks C_EVEN and C_ODD as input (e.g., as first clock path 406 and second clock path 408) to the fine delay line cell 420.

Figure 6:
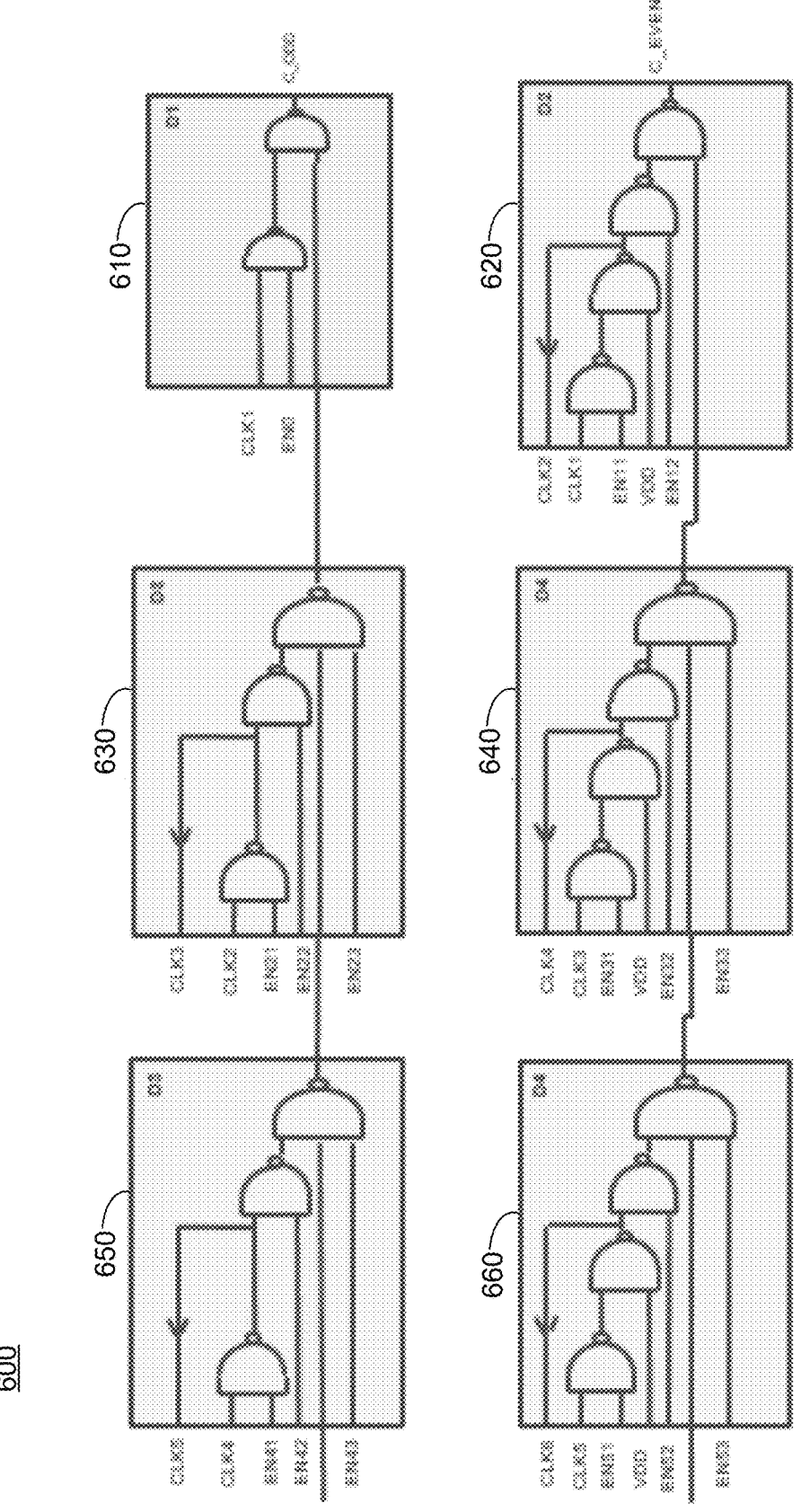
FIG. 6 is a diagram showing an example coarse delay line structure according to an embodiment of the present disclosure.

Referring to FIG. 6, an example coarse delay line structure 600 according to an embodiment of the present disclosure is shown. In some embodiments, the coarse delay line 410 may incorporate a structure similar to the coarse delay line structure 600 and may include four types of delay cells (e.g., D1, D2, D3, and D4) to form a coarse delay line. The delay line cell types D1 and D2 may be the first and second instances (shown as delay cell 610 and delay cell 620, respectively) of the coarse delay line (e.g., coarse delay line 410). The third and fourth instances (shown as delay cell 630 and delay cell 640, respectively) of the coarse delay line (e.g., coarse delay line 410) may be delay line cell types D3 and D4. The coarse delay line structure 600 may be extended further by adding more delay cell types D3 and D4 alternatively (e.g., shown as delay cell 650 and delay cell 660, respectively). In other words, the fifth (e.g., delay cell 650), seventh (not shown), and ninth (not shown) delay cells may be delay cell type D3, and the sixth (e.g., delay cell 660), eighth (not shown), and tenth (not shown) delay cells may be delay cell type D4. The clock CLK1 (shown at delay cell 610) may be an input clock to the coarse delay line (e.g., coarse delay line 410).

Figure 7A:
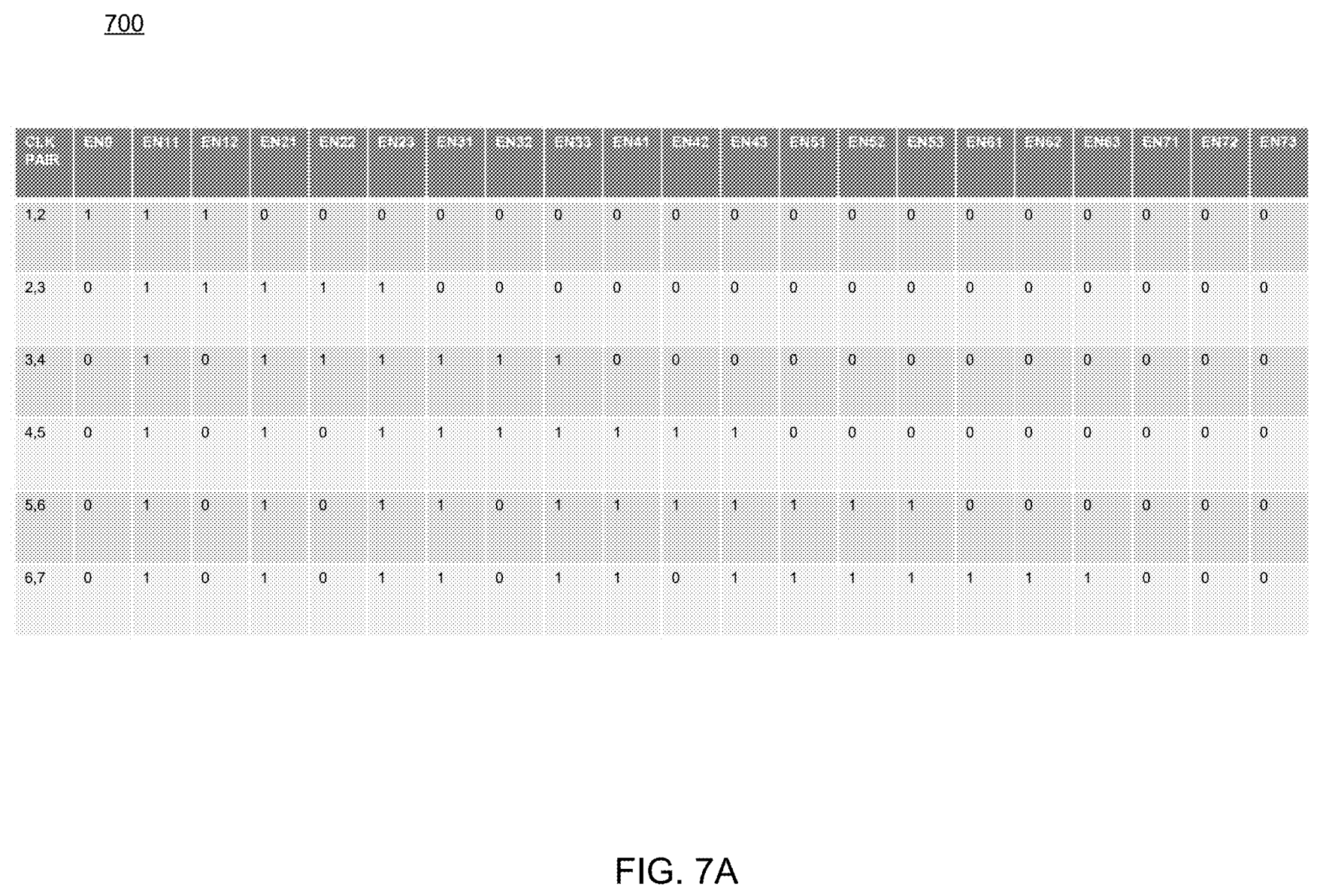
Figure 7C:
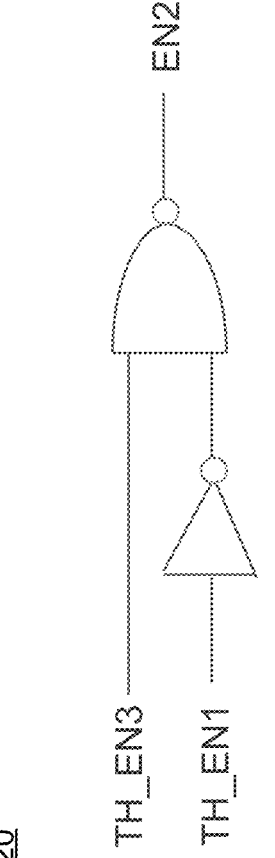
FIG. 7C is shows example logic according to an embodiment of the present disclosure.

Referring to FIG. 7A, an example delay line encoding table 700 according to an embodiment of the present disclosure is shown. The delay line encoding table 700 shows encoding or enable codes corresponding to the coarse delay line cells and may be used to increment and/or decrement the delay line code. The enable codes may be generated using a thermometric code input to the coarse delay line. Referring to FIG. 7B, a table 710 illustrating example thermometric code input according to an embodiment of the present disclosure is shown. The enable codes of FIG. 7A may be generated from the thermometric codes shown in FIG. 7B using logic. An example of such logic is illustrated by logic 720 of FIG. 7C. The delay line encoding of table 700 may ensure that the delay can be incremented and/or decremented on the delay line, one coarse code at a time, without disturbing the clock path being sent to the strobe delayed output 424.

Figure 8:
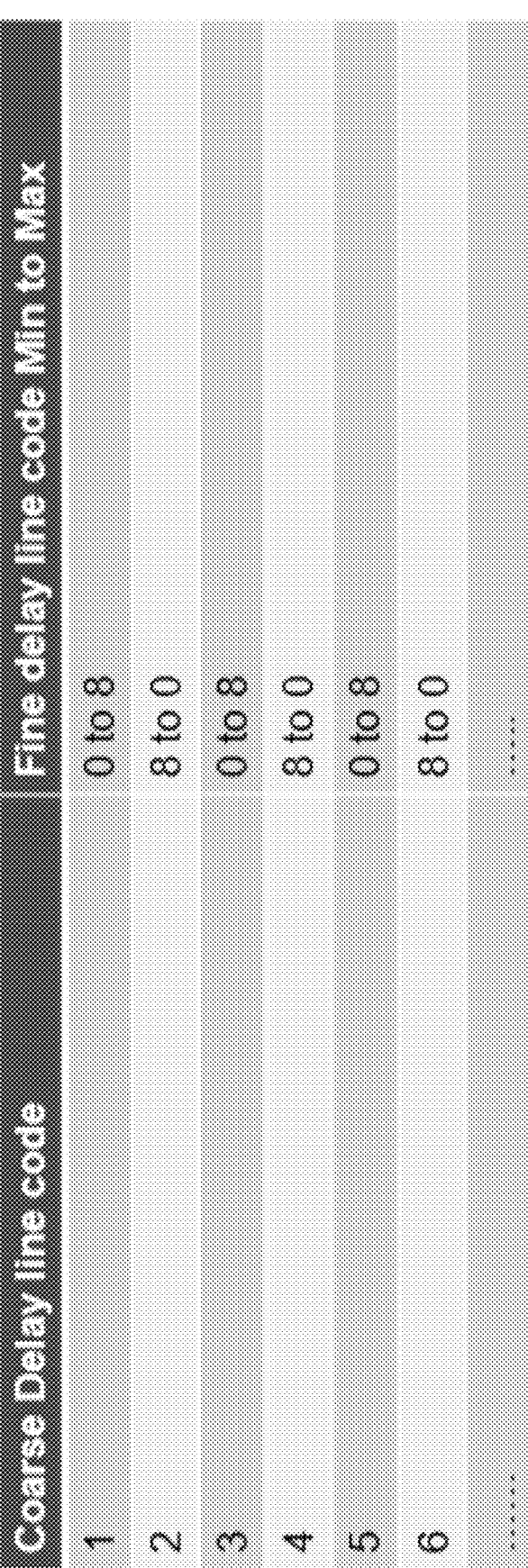
FIG. 8 is a table showing example delay line codes according to an embodiment of the present disclosure.

Referring to FIG. 8, a table 800 showing example delay line codes according to an embodiment of the present disclosure is shown. The table 800 shows fine delay line codes for a fine delay line cell (e.g., fine delay line cell 420 of FIG. 4) having 8 thermometric inputs and corresponding to coarse delay line codes. The fine delay line cell may have segments to enable switching of the delay in fine steps.

For example, the fine delay cell code may be represented by eight thermometrically encoded bits. For odd codes, 0 may be a minimum fine delay cell code. Code 0 on the fine delay cell may imply that all outputs depend on the C_ODD clock. For 0, all fine delay cell interpolator legs may be switched to the C_ODD clock. For even codes, 8 may be the minimum fine delay cell code. Code 8 on the fine delay cell may imply that all outputs depend on the C_EVEN clock. Switching the fine delay cell code to 8 may switch the interpolator legs to the C_EVEN clock. For 8, all fine delay cell interpolator legs may be switched to the C_EVEN clock.

For example, in an implementation of a fine delay cell (e.g., the fine delay cell 420 of FIG. 4), eight tristate inverters may be connected in parallel with the C_EVEN clock as input and eight tristate inverters may be connected in parallel with the C_ODD clock as input. The outputs of the tristate inverters may be shorted together. Each tristate inverter may be an interpolator leg. Code 8 on fine delay cell may enable the eight tristate inverters with the C_EVEN clock as input and may disable the eight tristate inverters with the C_ODD clock as input. Code 0 on fine delay cell may enable the eight tristate inverters with C_ODD clock as input and may disable the eight tristate inverters with the C_EVEN clock as input. Switching the fine delay cell code to 0 may switch all the interpolator legs to the C_ODD clock. Code 6 on fine delay cell may imply that the output clock is an interpolation of the C_EVEN clock and the C_ODD clock with the delay being two fine delay codes earlier than the C_EVEN clock and six fine delay codes later than the C_ODD clock.

The coarse delay line code may be switched by one code at a time. When dynamically switching the coarse delay line code, the output of the fine delay cell may preferably be set to depend on the clock which is not being switched on the coarse delay line. For example when the coarse delay line code is being switched from 4 to 6, the output clock is preferably set to depend only on the C_ODD clock and the fine delay line code may be 0. If the coarse delay line code is being switched from 5 to 7, the output clock may preferably be set to depend only on the C_EVEN clock and the fine delay code may be 8. This may ensure that the output clock of delay line does not have glitches when the coarse delay line code is being switched (e.g., as can be seen below in FIG. 15).

Switching the fine delay cell code may be performed after the coarse delay line code switching is performed. The fine delay codes may be switched one code at a time. Because the time gap between two fine delay codes is low, switching fine delay codes simultaneously (e.g., at near or about the same time) may not cause a glitch (e.g., as can be seen below in FIG. 16).

Figure 9:
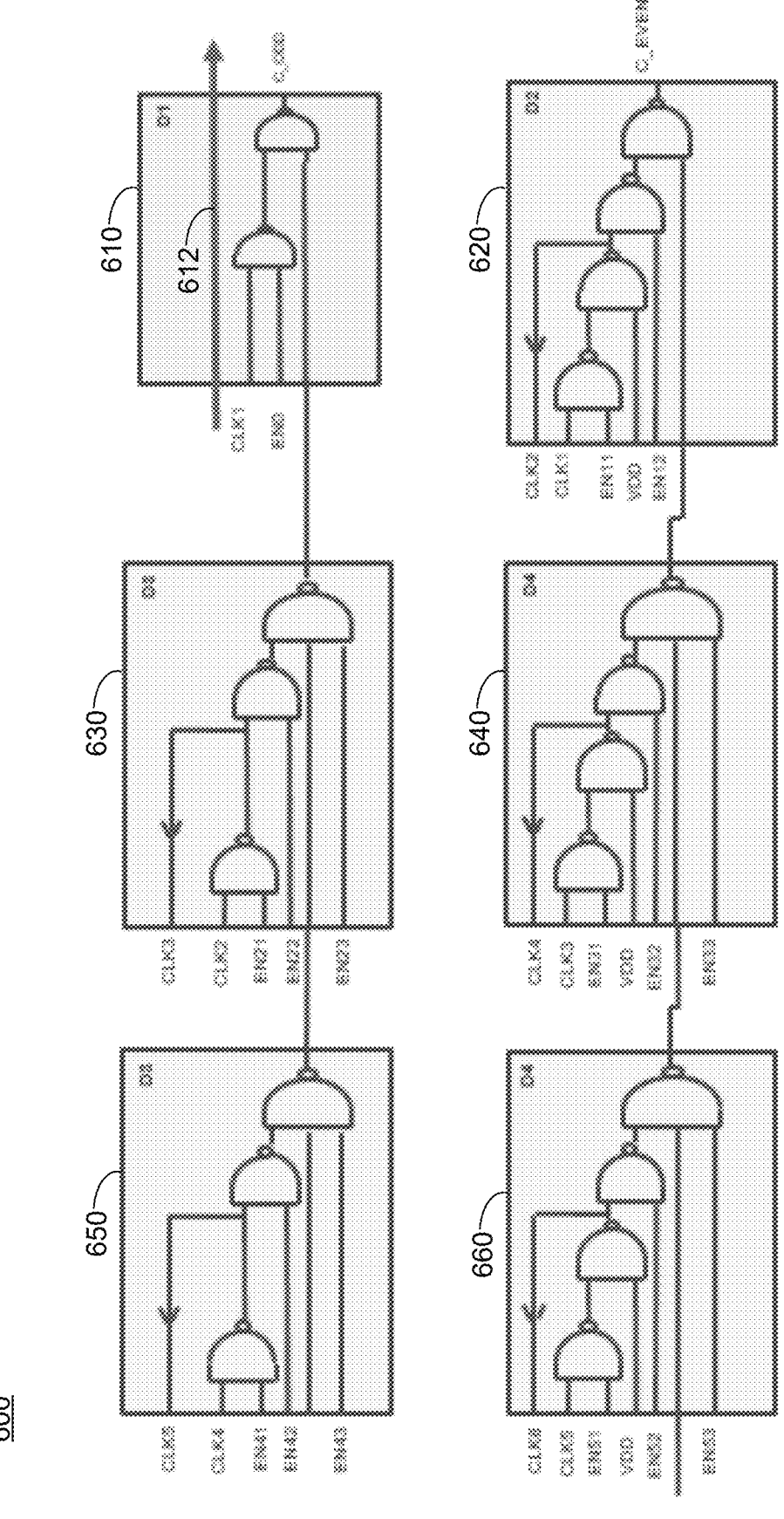
FIGS. 9-12 illustrate further details related to the coarse delay line structure of FIG. 6.

FIGS. 9-12 illustrate further details related to the coarse delay line structure 600 of FIG. 6. Referring to FIG. 9, for coarse delay line code 1, the output clock C_ODD of delay cell 610 may be generated from the clock CLK1 input by two NAND gate delays in delay cell 610. In other words, in the first coarse delay cell for the coarse delay line (e.g., coarse delay line 410), the clock CLK1 output may be sent to output C_ODD (e.g., as indicated by arrow 612).

Figure 10:
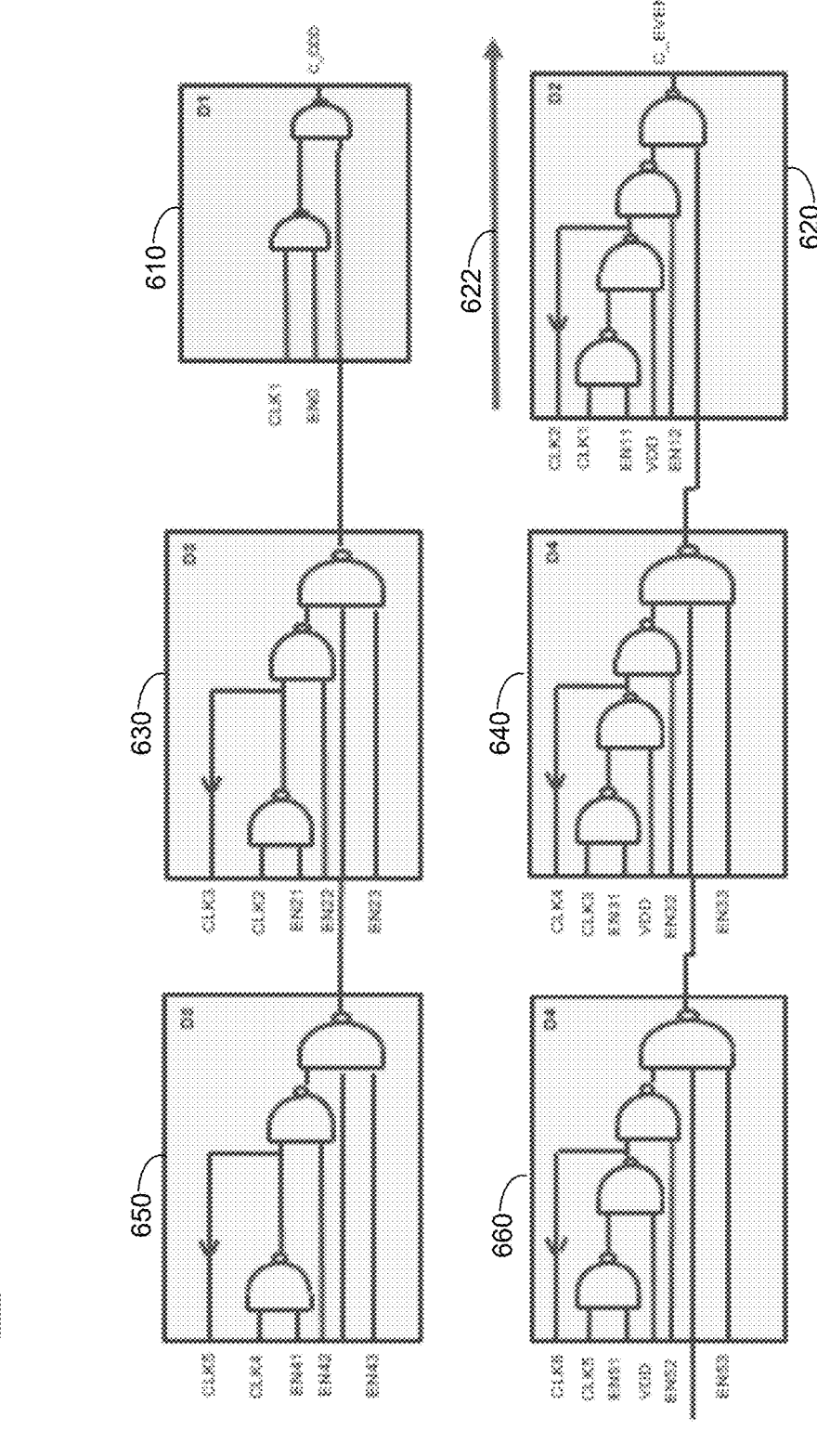

Referring to FIG. 10, for the coarse delay line code 2, the output clock C_EVEN may be generated from the clock CLK1 input by four NAND gate delays in the delay cell 620. An intermediate clock CLK2 may be generated and sent to the delay cell 630 with two NAND gate delays. In other words, for the second coarse delay cell for the coarse delay line (e.g., coarse delay line 410), the clock CLK1 may be delayed to generate clock CLK2, which may be sent output C_EVEN (e.g., as indicated by arrow 622). Reusing the clock CLK2 in the delay cell 630 may minimize a mismatch between the clocks C_EVEN and C_ODD and may also save area (e.g., in the PHY).

Figure 11:
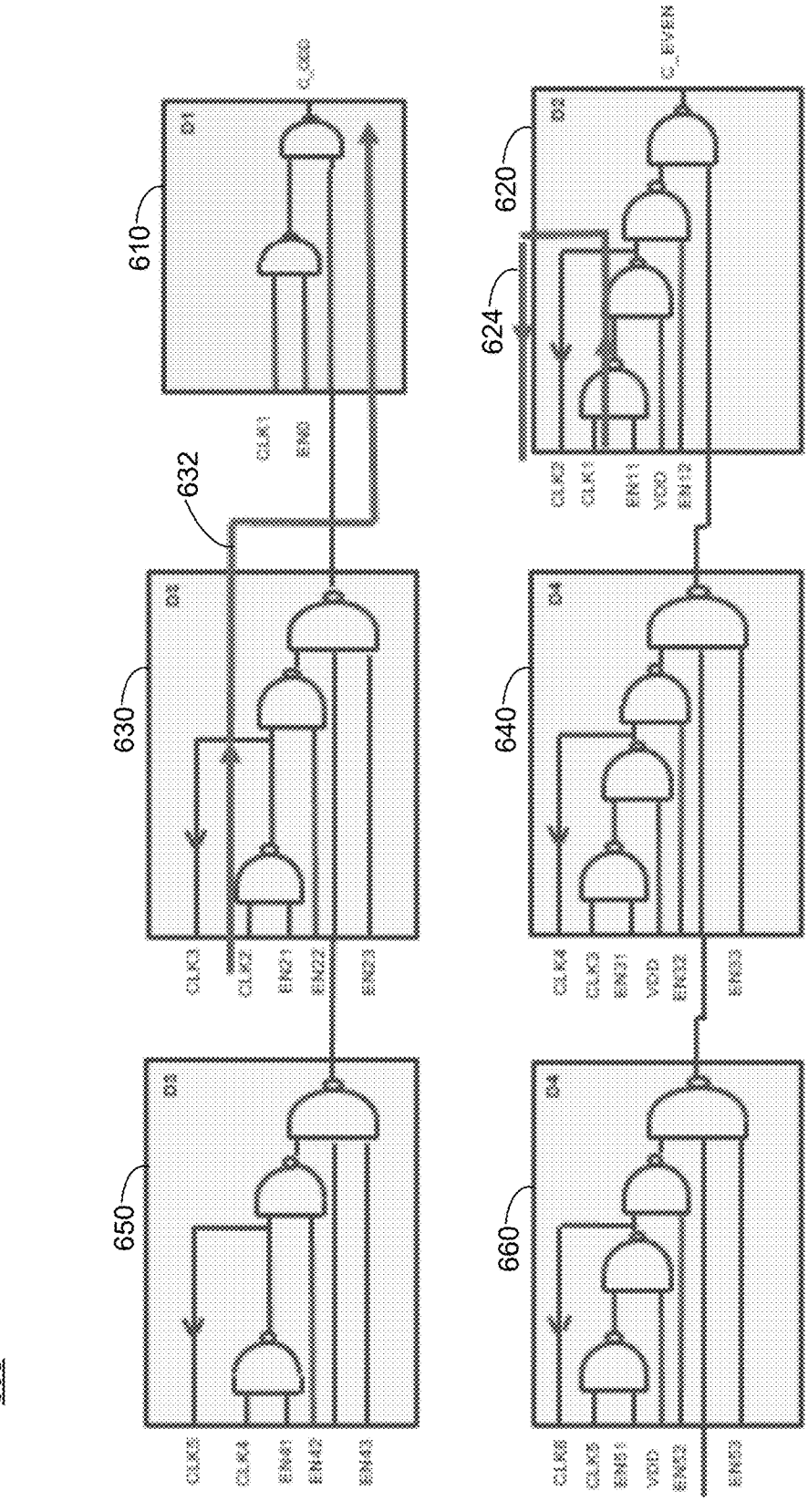

Referring to FIG. 11, for the coarse delay line code 3, the output clock C_ODD may be generated from the clock CLK2 input using four NAND gate delays in the delay cell 630 and delay cell 610. The total number of NAND gates from input clock CLK1 may be six NAND gates. An intermediate clock CLK3 may be generated from the clock CLK2 by one NAND gate and may be sent to delay cell 640. In other words, for the third coarse delay cell for the coarse delay line (e.g., coarse delay line 410), the clock CLK1 may be delayed to generate the clock CLK2 (e.g., as indicated by the arrow 624) and the clock CLK3, which may be sent to the output C_ODD (e.g., as indicated by the arrow 632).

Figure 12:
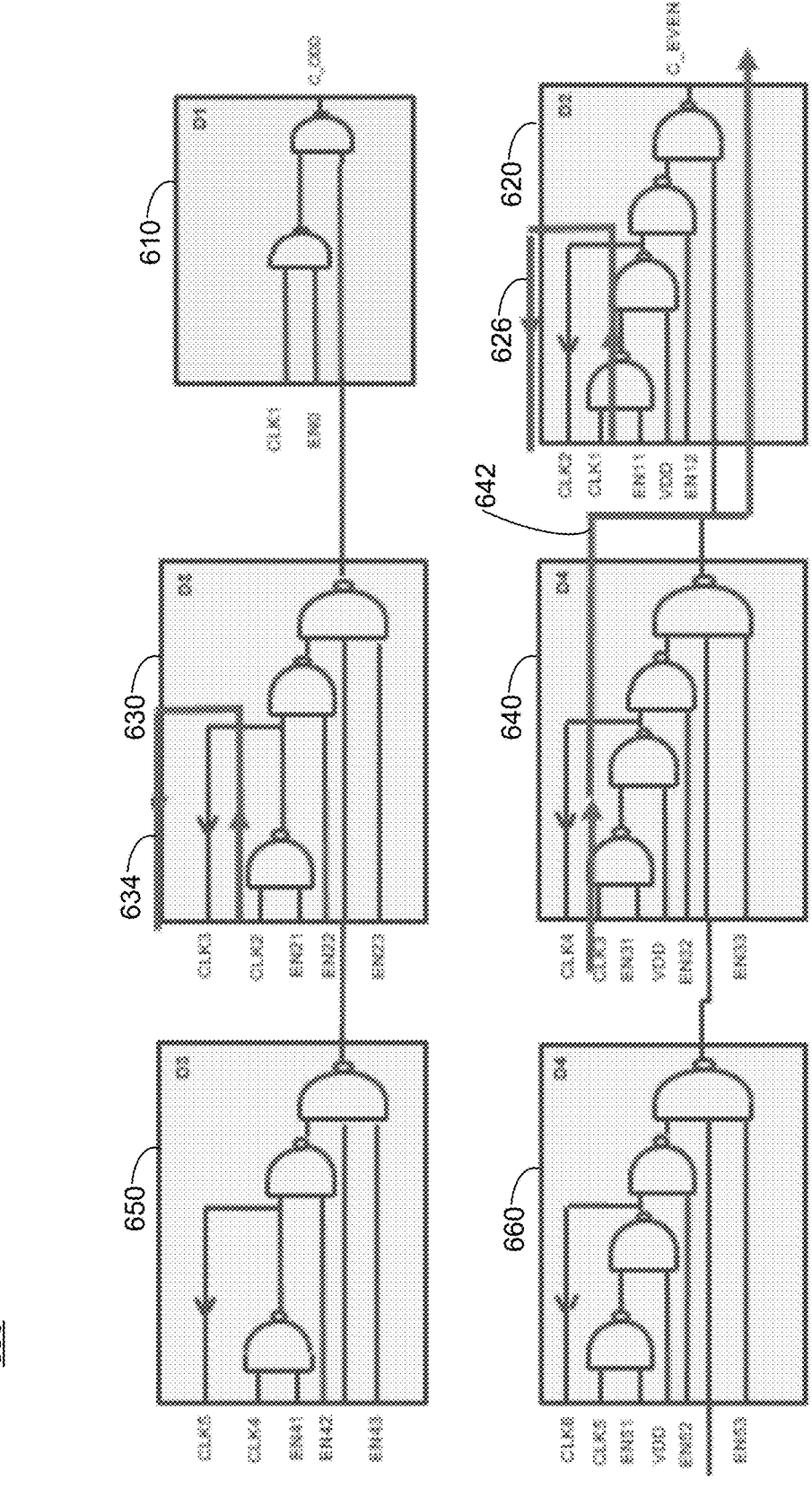

Referring to FIG. 12, for the coarse delay line code 4, the output clock C_EVEN may be generated by delaying the clock CLK3 by NAND gate delays in the delay cell 640 and the delay cell 620. An intermediate clock CLK4 may be generated from the clock CLK3 with 2 NAND gate delays and may be sent to the delay cell 650. In other words, for the fourth coarse delay cell for the coarse delay line (e.g., coarse delay line 410), the clock CLK1 may be delayed to generate the clock CLK2 (e.g., as indicated by the arrow 626), the clock CLK3 (e.g., as indicated by the arrow 634), and the clock CLK4 (e.g., as indicated by the arrow 642), which may be sent to the output C_EVEN.

Figure 13:
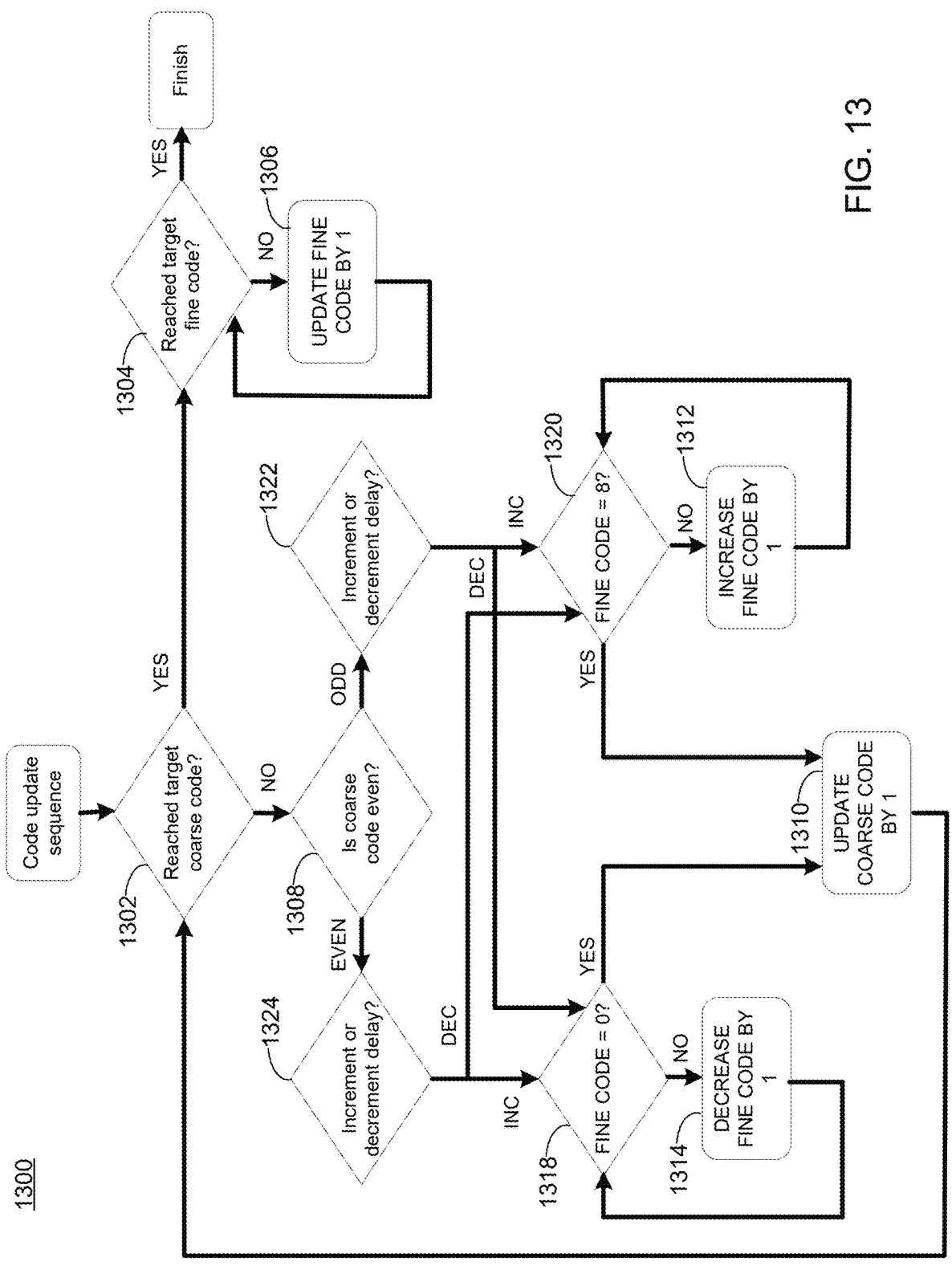
FIG. 13 is flowchart illustrating an example sequence for updating a delay line code according to an embodiment of the present disclosure.

Referring to FIG. 13, a flowchart illustrating an example method/sequence 1300 for updating a delay line code according to an embodiment of the present disclosure is shown. In some embodiments, the method 1300 for performing the code update sequence may include determining 1302 whether a target coarse code has been reached. The method 1300 may further include determining 1304 whether a target fine code has been reached. If the target coarse code and the target fine code have been reached, the sequence may be finished. The method 1300 may also include, if the target fine code is not reached, updating 1306 the fine code by one until the target fine code is reached. The method 1300 may additionally include, if the target coarse code is not reached, determining 1308 if the coarse code is even. Moreover, the method 1300 may include updating 1310 the coarse code until the target coarse code is reached.

In some embodiments, the method 1300 may include increasing 1312 the fine code if a coarse code is odd.

Increasing 1312 the fine code may be based on determining 1320 whether the fine code is not 8. Further, determining 1320 whether the fine code is not 8 may be based on determining 1322 whether to increment or decrement the delay (if the coarse code is odd). The method 1300 may further include decreasing 1314 the fine code if the coarse code is even. In some embodiments, decreasing 1314 the fine code may be based on determining 1318 whether the fine code is not 0. Further, determining 1318 whether the fine code is not 0 may be based on determining 1324 whether to increment or decrement the delay (if the coarse code is even).

Figure 14:
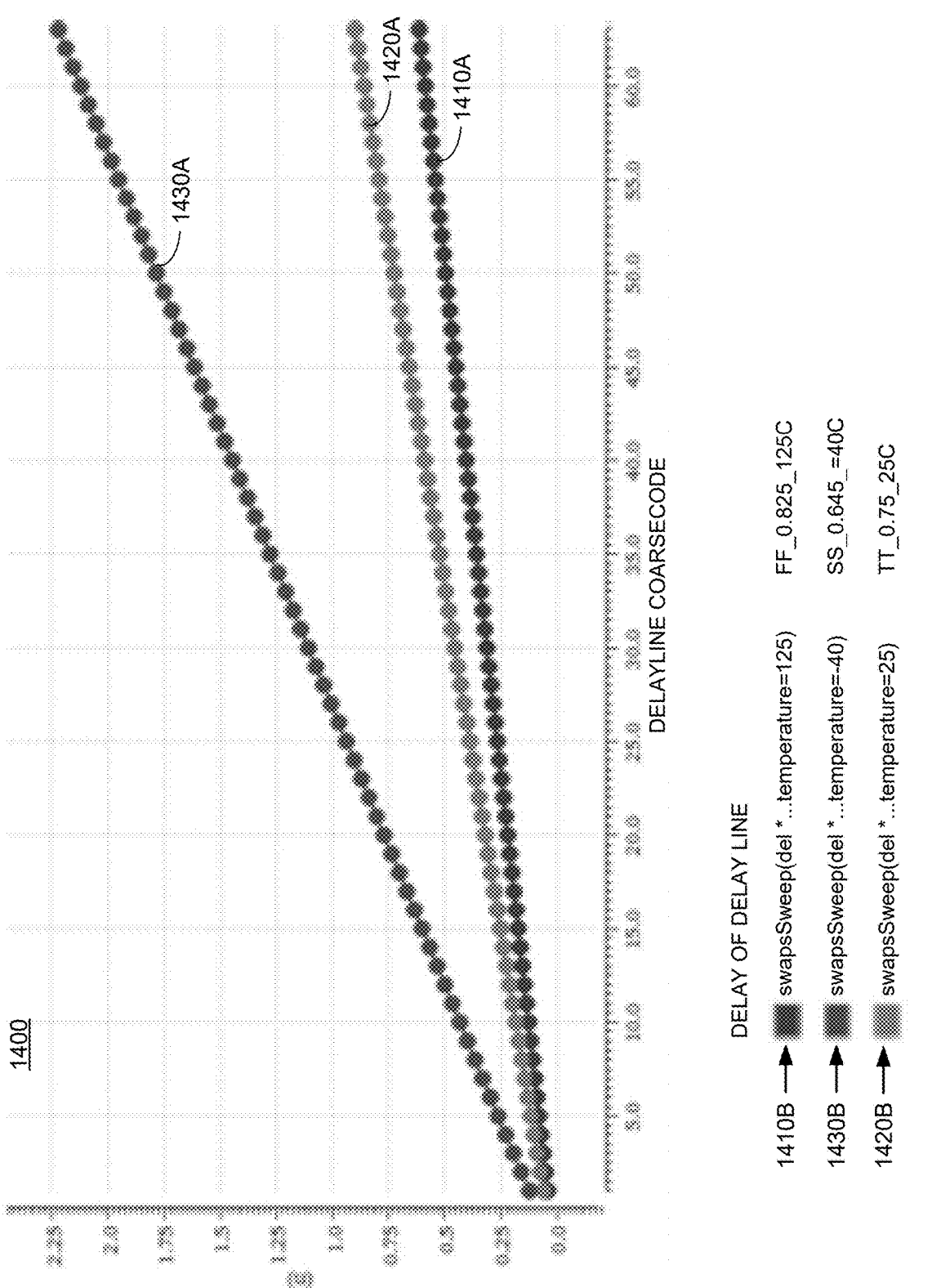
FIG. 14 is a graph illustrating an example output delay according to an embodiment of the present disclosure.

Referring to FIG. 14, a graph illustrating an example output delay according to an embodiment of the present disclosure is shown. The graph 1400 shows an output delay of a delay line with a sweep of coarse delay code. For example, the graph 1400 shows the delay of the delay line between the DQS strobe input 402 and the DQS strobe delayed output 424 as a function of the coarse delay line code 404. The X axis of the graph 1400 represents the coarse delay line code 404. The Y axis of the graph 1400 represents the delay between DQS strobe input 402 and the DQS strobe delayed output 424. The points 1410A illustrate measurements corresponding to a PVT corner 1410B where the delay has been measured. Further, the points 1420A illustrate measurements corresponding to a PVT corner 1420B where the delay has been measured. Additionally, the points 1430A illustrate measurements corresponding to a PVT corner 1430B where the delay has been measured.

Figure 15:
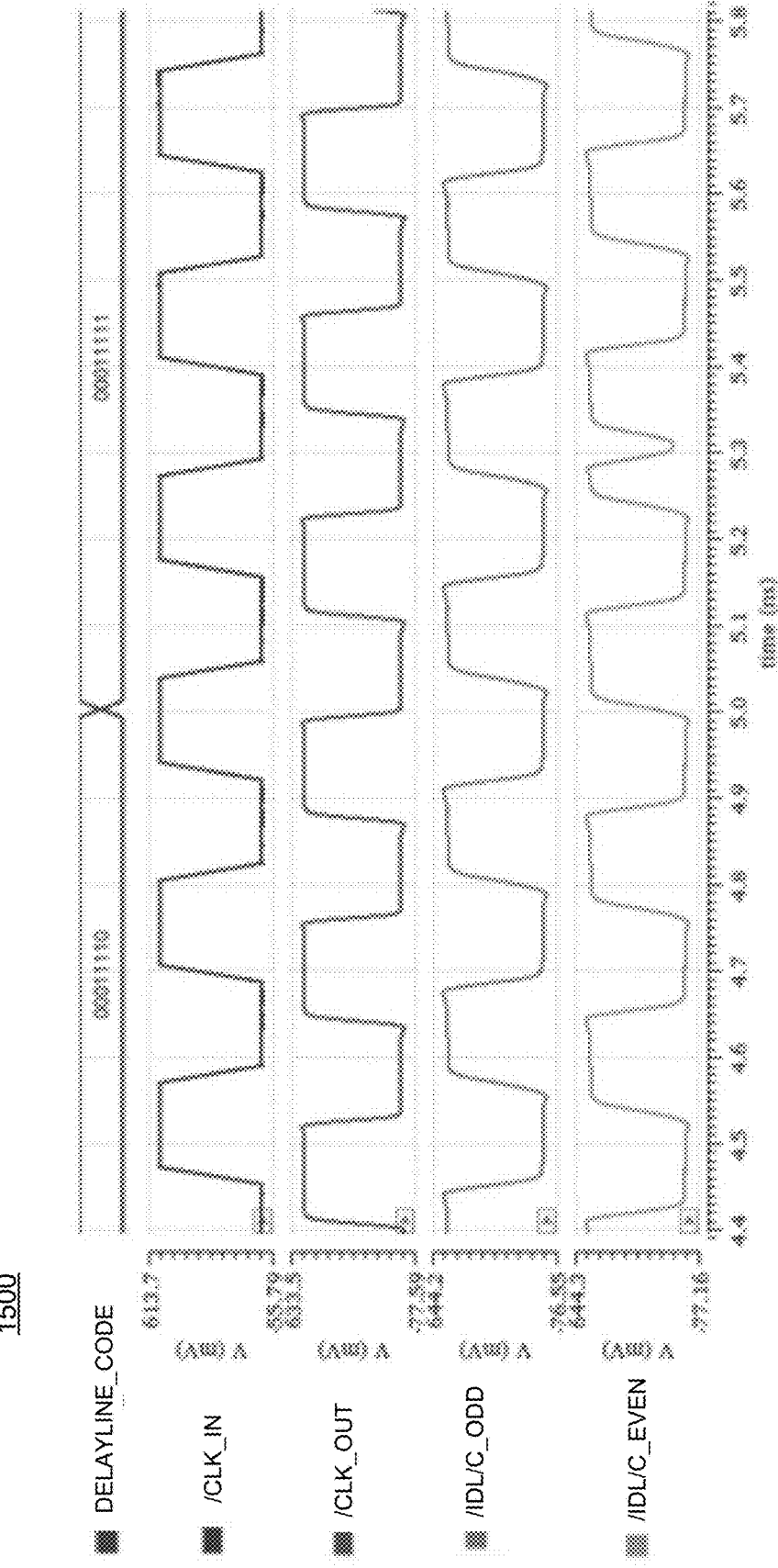
FIG. 15 is a graph illustrating an example delay line output according to an embodiment of the present disclosure.

Referring to FIG. 15, a graph 1500 illustrating an example delay line output according to an embodiment of the present disclosure is shown. /CLK_IN in the graph 1500 represents the DQS strobe input 402. /CLK_OUT in the graph 1500 represents the DQS strobe delayed output 424. /IDL/C_E-VEN in the graph 1500 represents the C_EVEN clock path 406 and /IDL/C_ODD represents the C_ODD clock path 408. DELAYLINE_CODE in the graph 1500 represents the coarse delay line code 404. The graph 1500 shows a delay line output (voltage) when switching the coarse delay line code from 0′b00011110 to 0′b00011111. As the fine delay code may be set to 0′b11111111, all the legs of fine delay interpolator may be switched based on the C_ODD clock input. As shown, switching delay line code from 0′b00011110 to 0′b00011111 causes a glitch on the C_EVEN clock path 406. Since fine delay line code is set to 0, a glitch (e.g., at near 5.3 ns) on C_EVEN clock path 406 does not cause a glitch on the DQS strobe delayed output 424 (/CLK_OUT).

Figure 16:
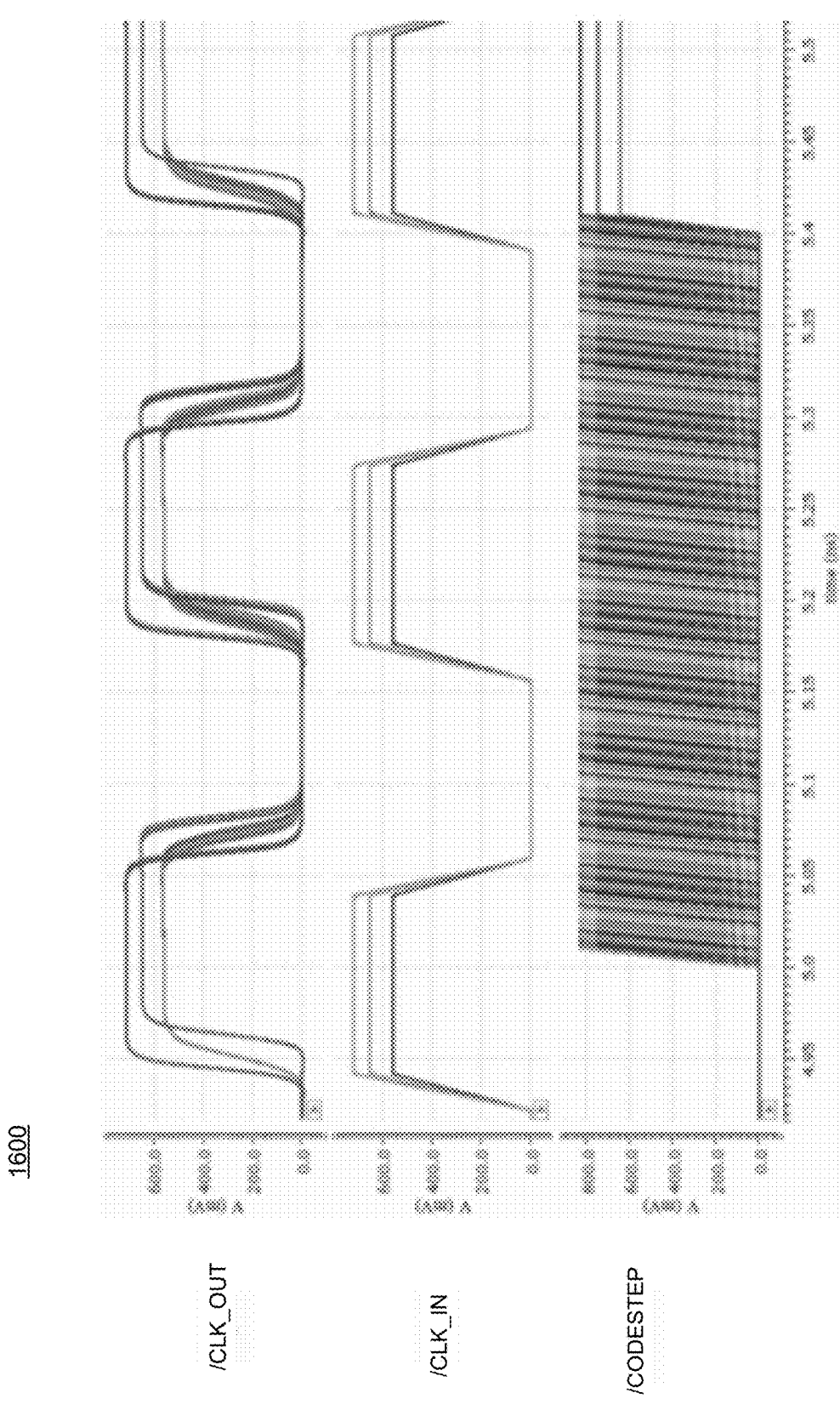
FIG. 16 is also a graph illustrating an example delay line output according to an embodiment of the present disclosure.

Referring to FIG. 16, a graph illustrating another example delay line output according to an embodiment of the present disclosure is shown. In the graph 1600 /CLK_IN represents the DQS strobe input 402 and /CLK_OUT represents the DQS strobe delayed output 424. When /CODESTEP is 0, the fine delay code 422 is 0 and when /CODESTEP is 1, the fine delay code 422 is 8. As can be seen in the graph 1600, switching the fine delay code 422 from 0 to 8 does not cause a glitch on/CLK_OUT (DQS strobe delayed output 424).

Figure 17:
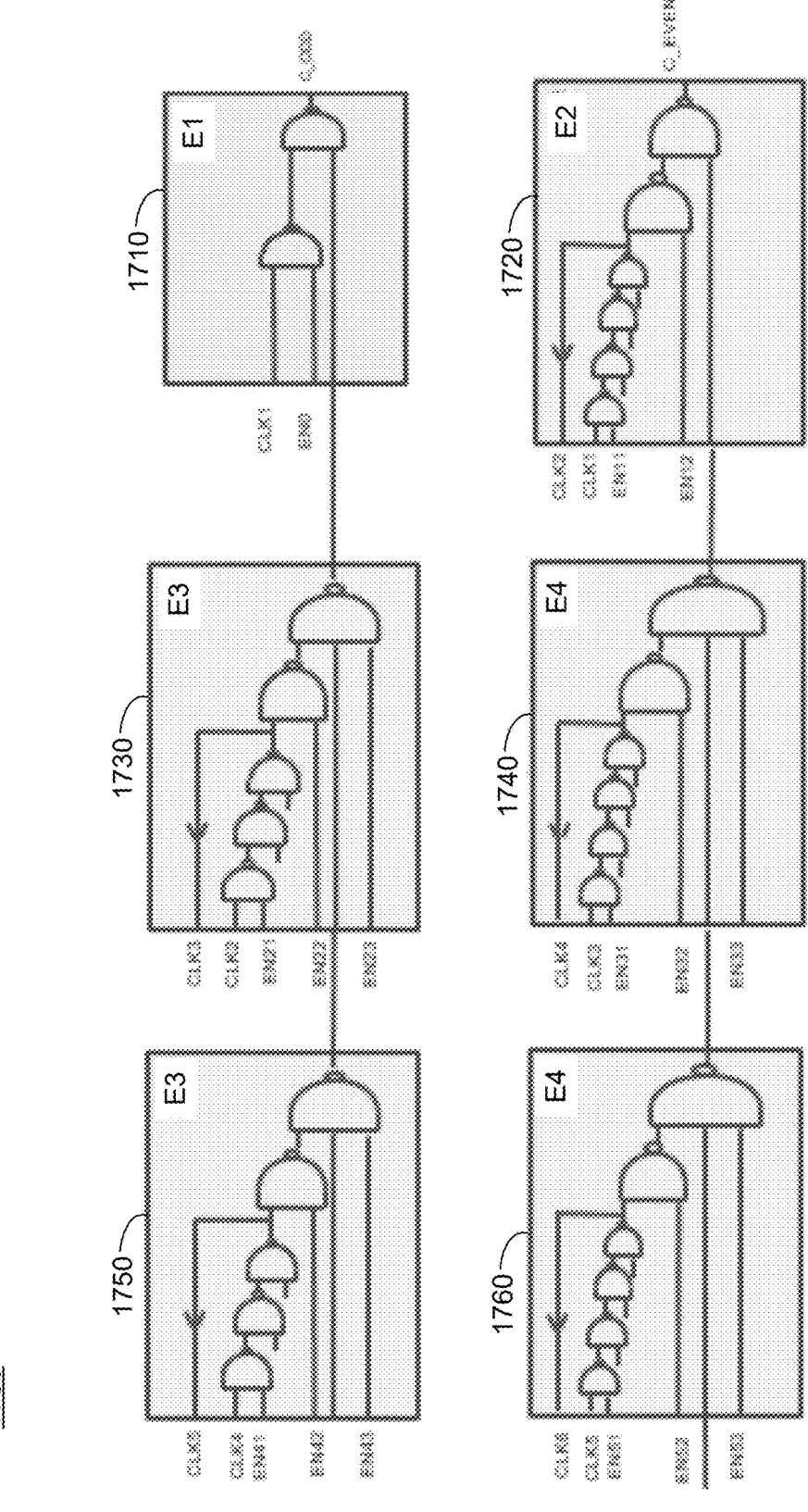
FIG. 17 is also a diagram showing an example coarse delay line structure according to an embodiment of the present disclosure.

Referring to FIG. 17, an example coarse delay line structure 1700 according to an embodiment of the present disclosure is shown. In some embodiments, the coarse delay line 410 may incorporate a structure similar to the coarse delay line structure 1700 and may include four types of delay cells (e.g., E1, E2, E3, and E4) to form a coarse delay line. The coarse delay line structure 1700 may include 4 NAND gates of resolution and thus the step size of the coarse delay line may be a delay of 4 NAND gates. The delay line cell types E1 and E2 may be the first and second instances (shown as delay cell 1710 and delay cell 1720, respectively) of the coarse delay line (e.g., coarse delay line 410). The third and fourth instances (shown as delay cell 1730 and delay cell 1740, respectively) of the coarse delay line (e.g., coarse delay line 410) may be delay line cell types E3 and E4. The coarse delay line structure 1700 may be extended further by adding more delay cell types E3 and E4 (e.g., shown as delay cell 1750 and delay cell 1760, respectively).

Referring now to FIGS. 18-28, embodiments of the present disclosure that are directed towards a glitch-free delay line architecture are provided. In some instances, DDR/LPDDR PHY may communicate with DRAM. In a write mode, IP sends data to DRAM and similarly in a read mode, it may read data from the DRAM. The memory may include different ranks in it, which refers to a set of different DRAM chips connected to the different chip select (CS). In normal operation, PHY sends data to DRAM's, for example one of the RANKs (e.g., "RANK1"). When DRAM wants to write (or read) data to a different rank, the PHY has to adjust all its settings including clock delay line settings according to the new RANK. This is referred to as a rank switch event. During a rank switch, the process may stop the data and gate the clock, may recalibrate it to the new location and start the data flow again. Since a RANK switch is a very frequent phenomena, the IDLE time available for the PHY to change the setting from one RANK to another RANK is lessened to ensure minimum throughput loss.

In certain architectures, there may be only 3TCK (DRAM operating clock) cycle to perform this and it may not be possible to change the code in a glided mode (e.g., 1 code at a time) because it may not be done within 3TCK. As such, only a large code jump (non-glided mode) may be available. Some may show a glitch at the output during such a non-glided code jump. Accordingly, embodiments included herein may address this concern.

During a rank-to-rank switch, the delay code update may be in a non-glided mode. Since the rank-to-rank switch time is just 3TCK, delay code updates may not be performed in a glided mode. If only 3TCK is the bottleneck, embodiments included herein may need to work across all the data rates within the given time. For certain delay line implementations, a non-glided code update may result in a glitch at the delay line output. Particularly, when the amount of code update needed is more than 1 coarse code. Any CLK glitch may disturb the pointer synchronization and needs to be avoided.

Figure 18:
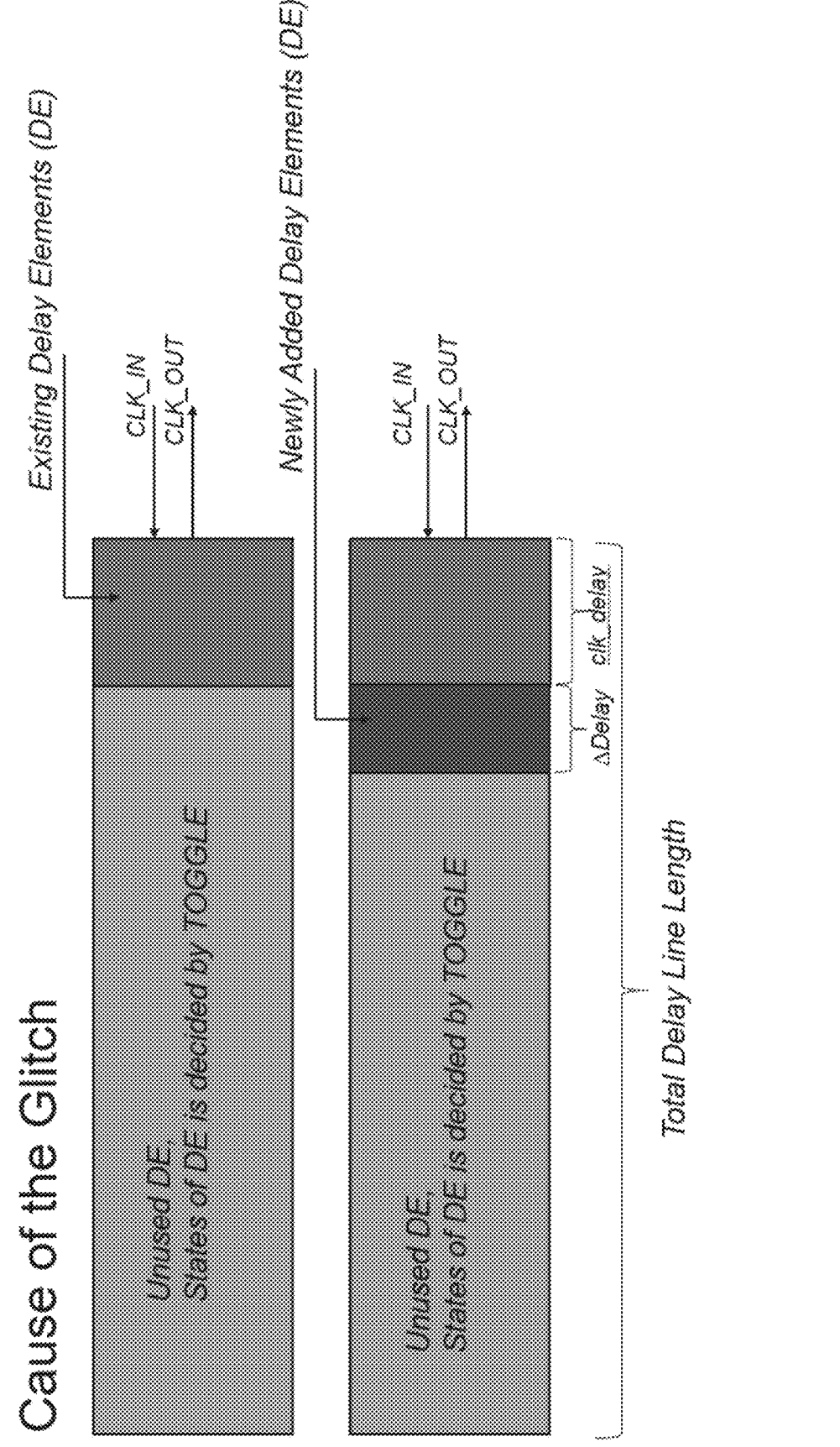
FIG. 18 is a diagram showing some example causes of glitches according to an embodiment of the present disclosure.

Referring now to FIG. 18, a diagram 1800 showing some example causes of glitches according to an embodiment of the present disclosure is provided. In this particular example, unused delay elements, existing delay elements and newly added delay elements are depicted. The state of a newly added delay element may be decided by a slow CLK (e.g., "TOGGLE"). The TOGGLE state may be unknown and may include a large propagation delay. Hence, it may cause the glitch to occur at the output. In this example "Glitch Width"=ΔDelay and "Glitch Propagation Delay until output"=ΔDelay+(clk_delay/2) where only the return path of clk_delay may occur (e.g., clk_delay/2). One approach is to gate the TOGGLE when the clock is gated for a RANK switch event and wait until the time TOGGLE is flushed out of the delay line. Unfortunately, the TOGGLE propagation delay may be very high, since it travels to the end of the delay line and comes back until the last unused element. Embodiments included herein are configured to ensure that delay line code updates may be performed in a non-glided mode without causing the glitch within a given time (e.g., 3TCK).

Figure 19:
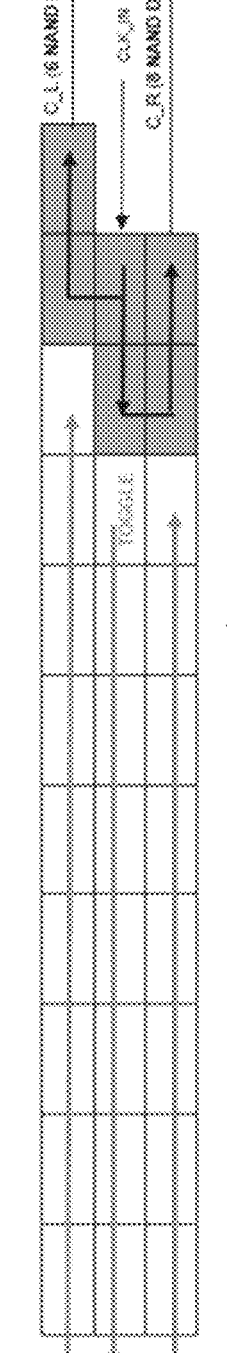
FIG. 19 is a diagram showing some example mechanisms for eliminating glitches according to an embodiment of the present disclosure.
Figure 19:
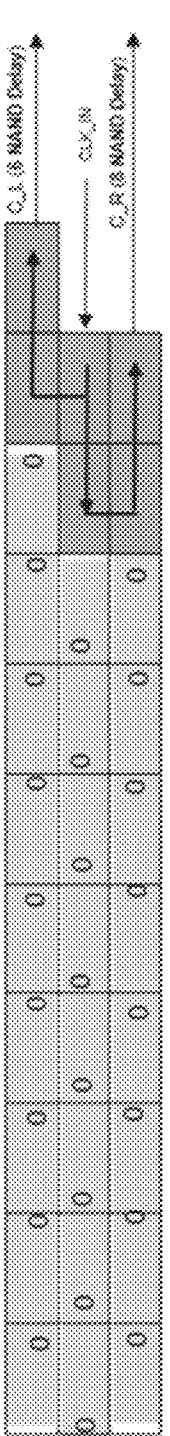
Figure 19:
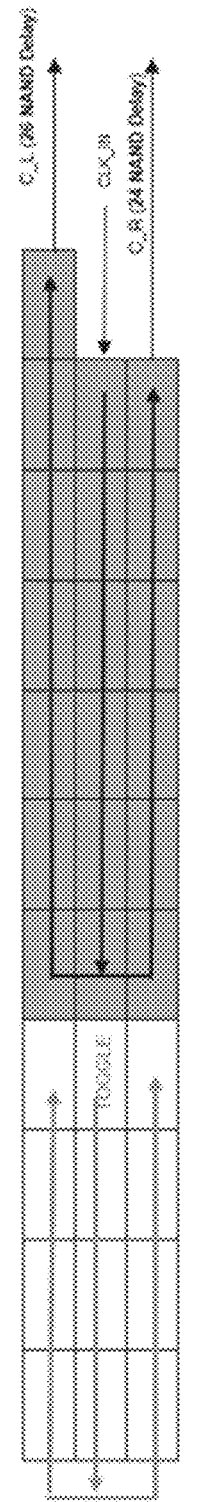

Referring now to FIG. 19, a diagram 1900 showing some example mechanisms for eliminating glitches according to an embodiment of the present disclosure is provided. Because of the dependency on CLK_GATING_ACK, embodiments of the present disclosure may operate independently and may be universal for all data rates. Accordingly, in some embodiments the methods included herein may be configured to force the output of a portion of the delay line to 0 when CLK_GATING is HIGH, then without disturbing CLK path, the glitch may be eliminated. Numerous approaches may be employed to achieve this as are discussed in further detail hereinbelow.

Figure 20:
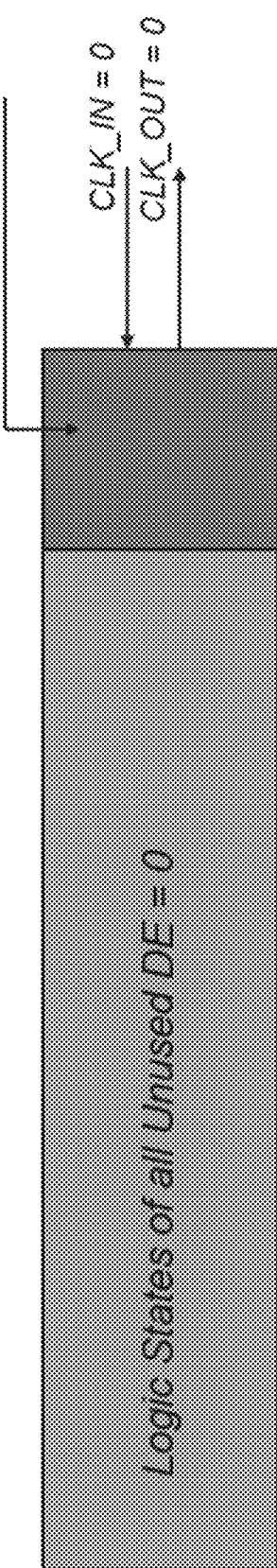
FIG. 20 is a diagram showing a mechanism to flush an unused part of a delay line according to an embodiment of the present disclosure.

Referring now to FIG. 20, a diagram 2000 showing a mechanism to flush an unused part of a delay line according to an embodiment of the present disclosure is provided. The process may include flushing an entire unused part of the delay line delay element logic state to 0 in a single instant. A CLK_GATING_REQ signal may be used for this purpose. Logic may be added to a hard macro to ensure that all unused stages in the delay line may be flushed to logic state 0. There may not be any constraint on updating the delay line code. Additionally and/or alternatively, the delay line code may change from any code to any code without any dependency on data rate, delay per delay element, etc. A soft macro may be used to change delay line codes by changing from RANK 0 code to RANK 1 code based on CLK_GATING_ACK. It may not be necessary to add any stop points.

Figure 21:
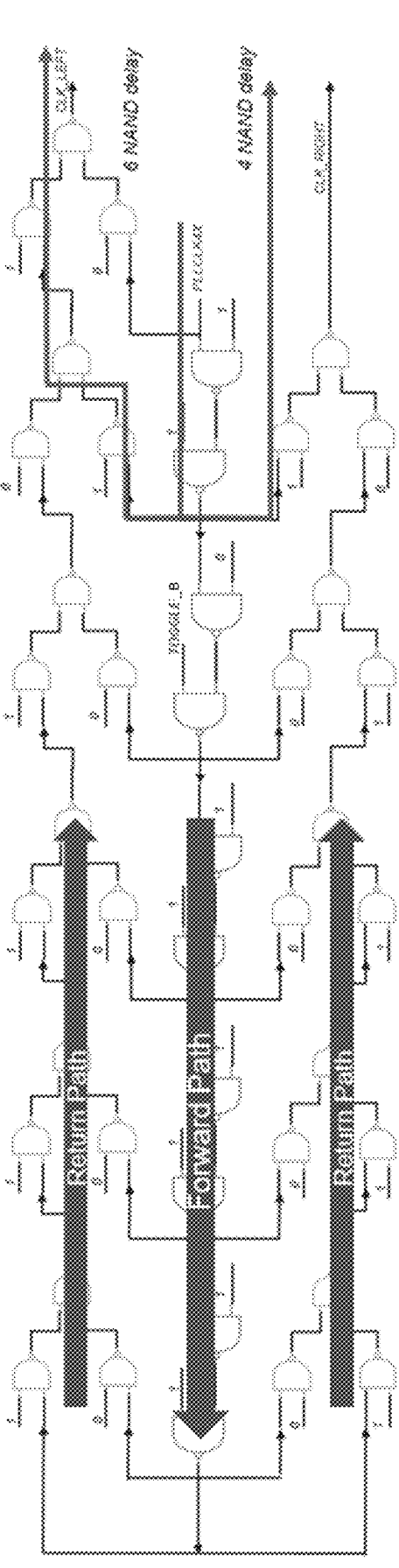
FIG. 21 is a diagram showing an example delay line according to an embodiment of the present disclosure.

Referring now to FIG. 21, a diagram 2100 showing an example delay line according to an embodiment of the present disclosure is provided. Diagram 2100 includes a delay line structure, where an unused part of the delay line has a forward and return path. A glitch may occur when a code update is performed because one or more states of the forward or return path is either at 0 or 1, and that may be flushed out in the form of glitch when the code update is performed. By ensuring that prior to any code update, all of the states of forward and return path are 0, then the glitch may be eliminated. To address this, it may be necessary to force those states to 0 as is discussed in further detail hereinbelow.

Figure 22:
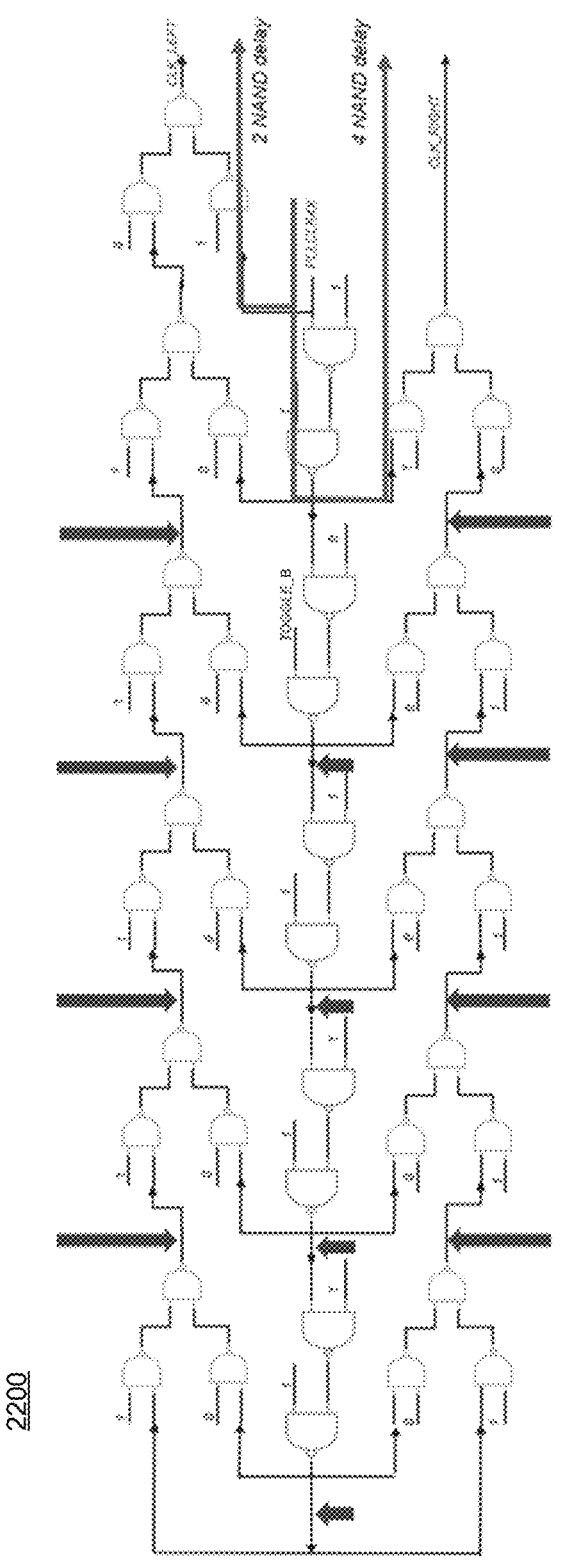
FIG. 22 is a diagram showing an example delay line according to an embodiment of the present disclosure.
Figure 22:
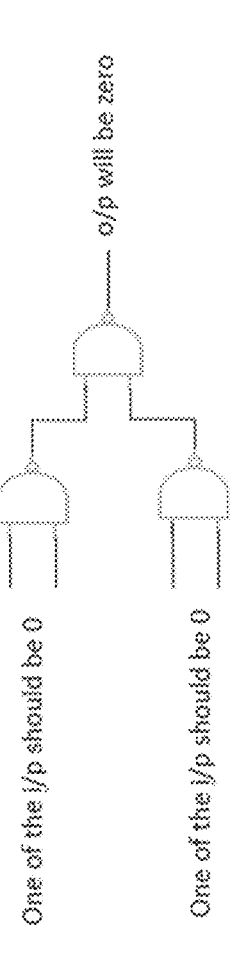
Figure 27:
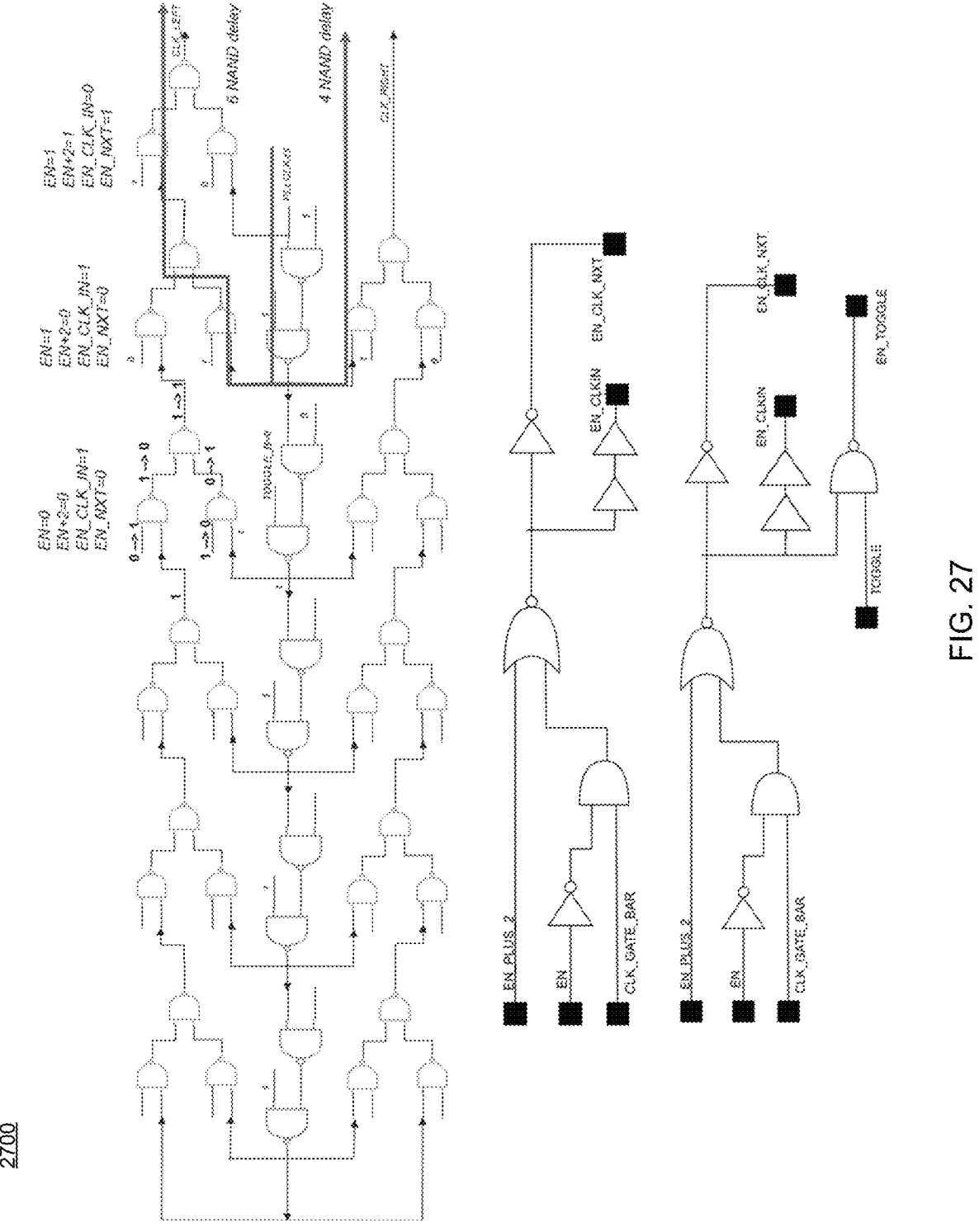
FIG. 27 is a diagram showing an example delay line according to an embodiment of the present disclosure.

Referring now to FIG. 22 a diagram 2200 showing an example delay line according to an embodiment of the present disclosure is provided. Diagram 2200 shows a methodology that may be used to force internal nodes of a delay line to a predefined known logic state (e.g., logic 0 or logic 1 based on input clock PLLCLK4X polarity during clock gating) at a single instant before the code update. Considering, input clock PLLCLK4X polarity is logic 0 during clock gating, this may be achieved by applying a zero to one of the inputs of first stage NANDs. FIG. 27 depicts an example where the input clock PLLCLK4X polarity is logic 1.

Figure 23:
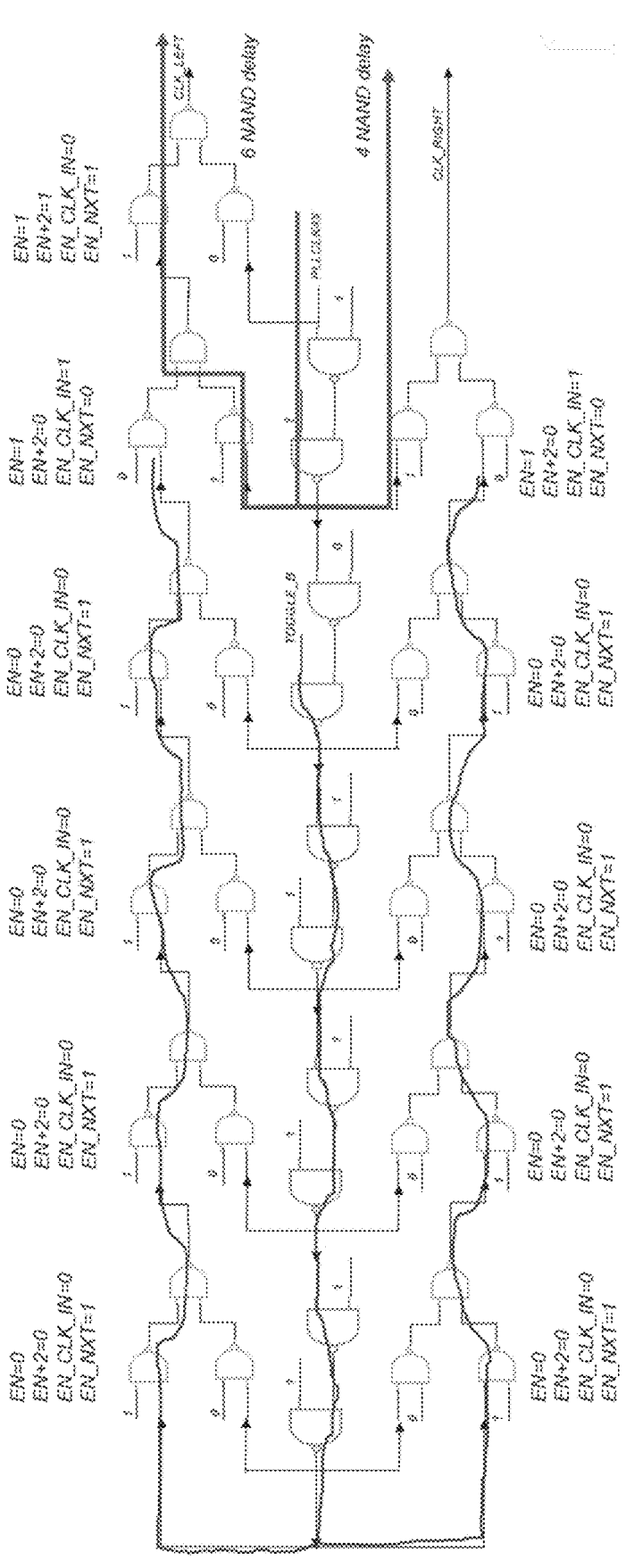
FIG. 23 is a diagram showing an example delay line according to an embodiment of the present disclosure.

Referring now to FIG. 23, a diagram 2300 showing an example delay line according to an embodiment of the present disclosure is provided. Diagram 2300 shows a delay line structure where RANK_SWITCH=0. In this particular example, the code is 2 (e.g., 0000 0011).

Figure 24:
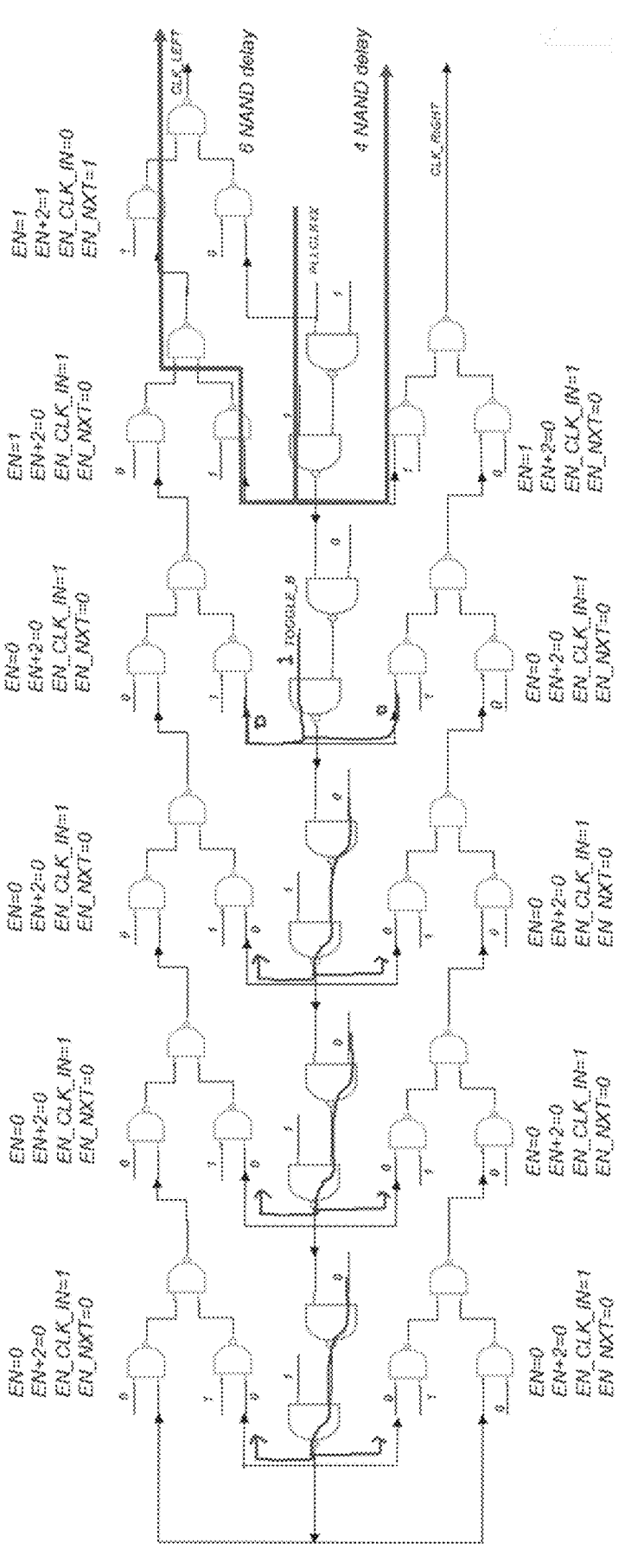
FIG. 24 is a diagram showing an example delay line according to an embodiment of the present disclosure.

Referring now to FIG. 24, a diagram 2400 showing an example delay line according to an embodiment of the present disclosure is provided. Diagram 2400 shows a delay line structure where RANK_SWITCH=1. In this particular example, the code is 2 (e.g., 0000 0011). As shown in FIG.

24, the approach ensures that the condition of forcing a return path to 0 is met. This is an example when RANK switch request is enabled.

Figure 25:
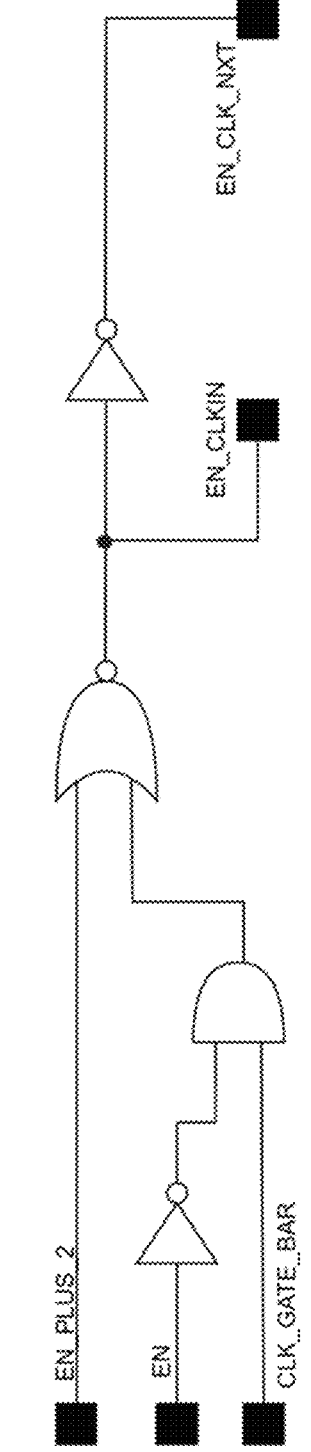
FIG. 25 is a diagram showing an example of ODD cell logic according to an embodiment of the present disclosure.
Figure 26:
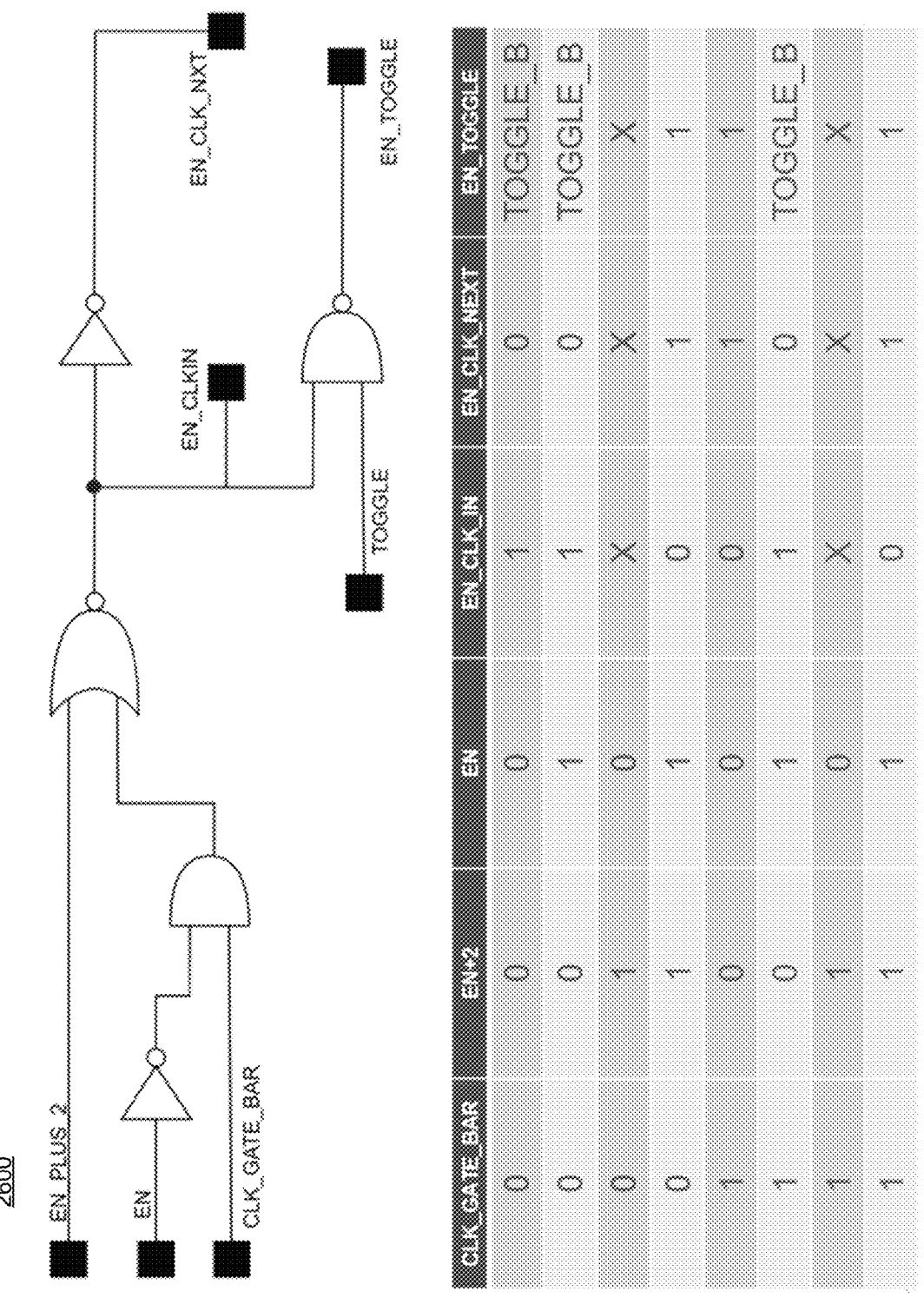
FIG. 26 is a diagram showing an example of EVEN cell logic according to an embodiment of the present disclosure.

Referring now to FIGS. 25-26, a diagram 2500 showing an example of ODD cell logic according to an embodiment of the present disclosure is provided and a diagram 2600 showing an example of EVEN cell logic according to an embodiment of the present disclosure is provided.

Figure 28:
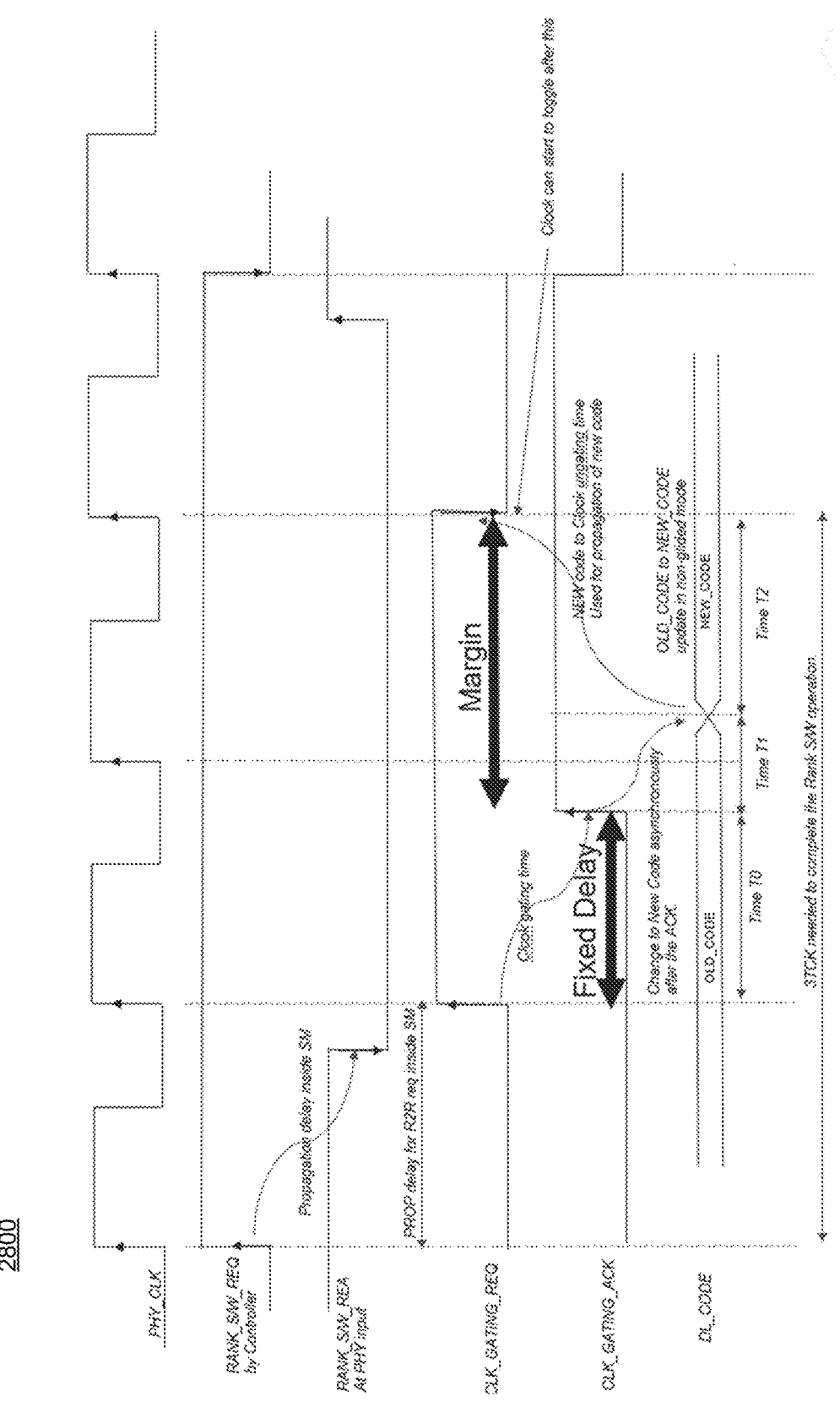
FIG. 28 is a timing diagram showing an example according to an embodiment of the present disclosure.

Referring now to FIG. 27, a diagram 2700 showing an example delay line according to an embodiment of the present disclosure is provided. Diagram 2700 shows a delay line structure where RANK_SWITCH=1. In this particular example, the code is 2 (e.g., 0000 0011). In this condition, as described due to the input of NAND are flipping at the same time, a small glitch is formed. By delaying the bottom input of the NAND, this indicates that it will stay at 0 for long time, with in that time other input of NAND must have already settled to 0 (From 1), and by ensuring that, there is no glitch. Some example solutions are provided at the bottom portion of FIG. 27. FIG. 28 is a timing diagram showing an example according to an embodiment of the present disclosure.

Figure 29:
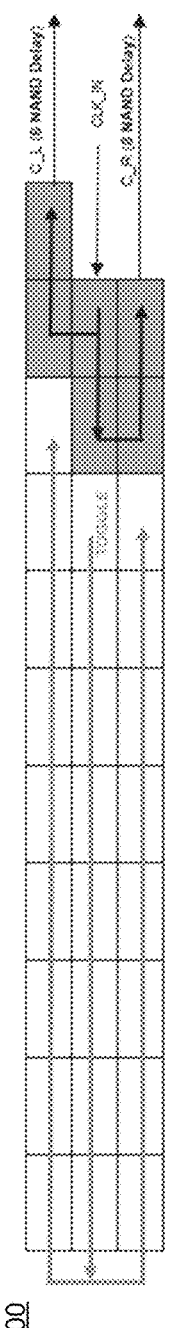
FIG. 29 is a diagram showing an example delay line according to an embodiment of the present disclosure.
Figure 29:
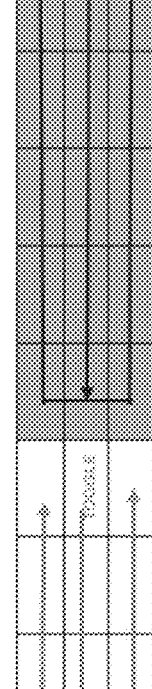
Figure 30:
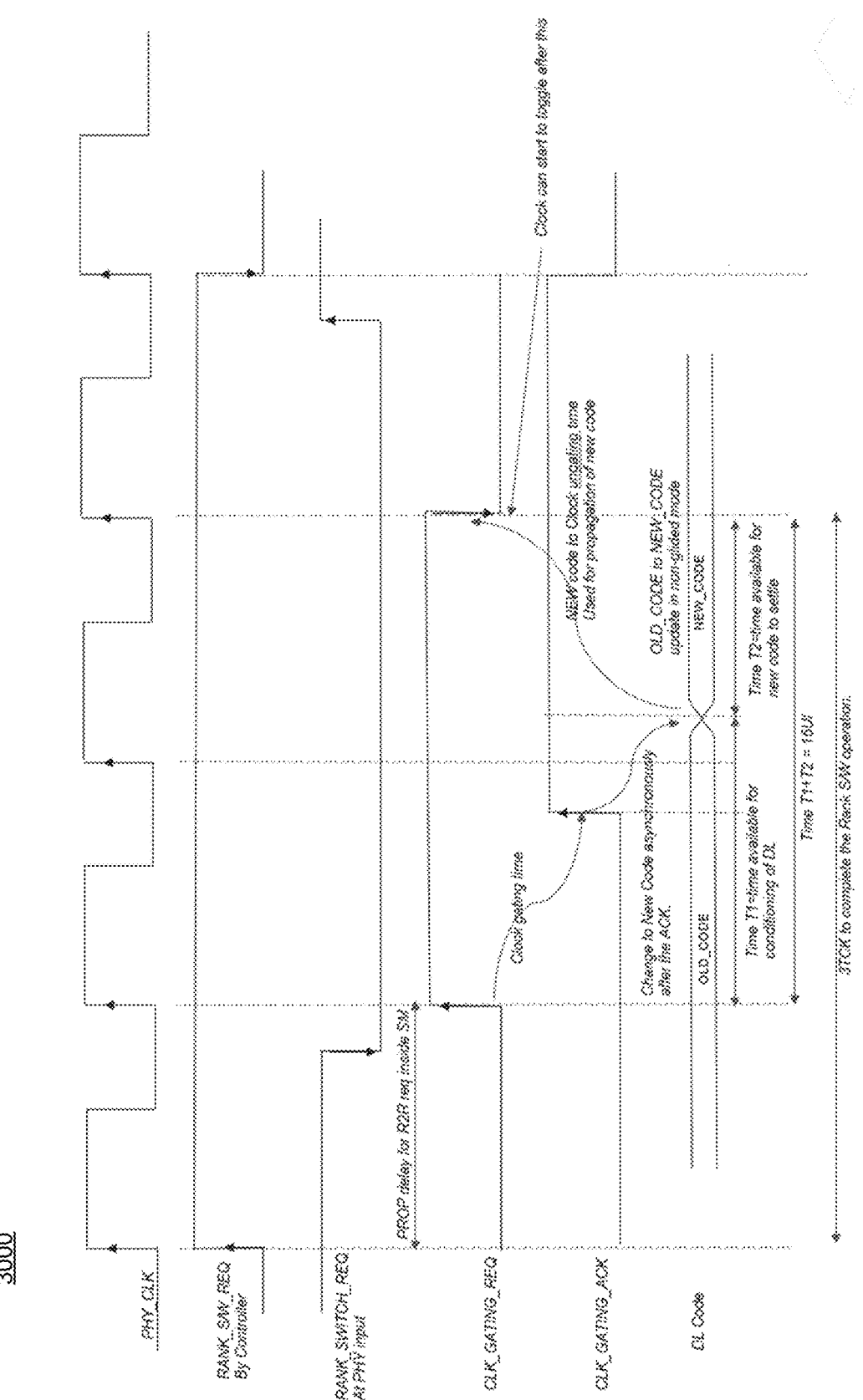
FIG. 30 is a timing diagram showing an example according to an embodiment of the present disclosure.

Referring now to FIGS. 29-30, embodiments of the present disclosure directed towards an alternative approach are depicted. In this example, the delay line may be bypassed when the rank switch request may be asserted by adding some extra logic in hardware. As shown in FIG. 29, the output of the delay line may be bypassed to a gated clock, so the glitch may still be present, but it is not being propagated to the upcoming path. FIG. 29 depicts one possible process. FIG. 30 depicts an associated timing diagram. The biggest problem is the uncertainty of CLK_GATING_ACK signal, CLK_GATING_ACK should indicate that all the valid clock edges have passed through the clock path and there are no missing clock edges. This is especially important in this solution since the we are disturbing the main used clock path. If CLK_GATING_ACK comes any time later than 2TCK, we may not be able to meet rank to rank switch time of 3TCK. If we do not want to rely on CLK_GATING_ACK signal, then the embodiments discussed above may be employed, which should touch only the unused part of the clock path and should have reduced propagation delay.

In some cases, a bottleneck may arise surrounding the uncertainty of CLK_GATING_ACK signal, which is delayed version (by adding buffers) of CLK_GATE_REQ signal. This delay may be fixed UI based, hence it may affect the margin shown in timing diagram when data rates increase. As such, the approach of FIGS. 19-28 may be preferred if there are higher data rates. For lower data rates where there is enough margin, the approach of FIGS. 29-30 may be used. For higher data rates, the approach of FIGS. 19-28 does not have dependency on CLK_GATING_ACK signal. Accordingly, embodiments included herein provide options that are independent on data rates because clearing out unused states to 0 is very fast (e.g., only 6 gate delays).

The techniques and features described by the present disclosure (e.g., the structures, architectures and schemes provided herein) may eliminate the need for the clock gating and sequencing schemes discussed above, which may save area and power characteristics of the system, and reduce complexity, thus saving man hours spent on execution and verification of the system. The structures, architectures and schemes described herein may be compact, area efficient, modular, and extendable to create more delay in the delay line easily. The modular delay line structures, architectures and schemes provided herein may enable a regulator layout of a delay line, which may ensure linearity of delay line code and ease of layout.

It will be apparent to those skilled in the art that various modifications and variations can be made to the embodiments of the present disclosure as described without departing from the spirit or scope of the invention. Thus, it is intended that embodiments of the present disclosure cover the modifications and variations of this invention provided they come within the scope of the appended claims and their equivalents.

What is claimed is:

1. A method for updating a delay line code, comprising:
receiving a strobe input at a delay line;
receiving a delay cell code at the delay line;
generating a first clock path based upon a first chain of interleaved logic gates included within the delay line;
generating a second clock path based upon a second chain of interleaved logic gates included within the delay line, wherein an output of at least one logic gate is forced to zero prior to performing a code update.

2. The method of claim 1, wherein the delay line includes a plurality of delay cells associated with the first clock path.

3. The method of claim 1, wherein the delay line includes a plurality of delay cells associated with the second clock path.

4. The method of claim 3, wherein each of the plurality of delay cells includes a plurality of NAND gates.

5. The method of claim 1, wherein the output of the at least one logic gate is forced to zero by providing a zero as an input to a single logic gate of the at least one logic gate.

6. The method of claim 1, wherein the code update is performed using a glided mode or a non-glided mode.

7. The method of claim 1, wherein the delay line is bypassed when a rank switch request is asserted.

8. The method of claim 1, wherein the delay line is a coarse delay line.

9. The method of claim 1, wherein the delay line is a fine delay line.

10. The method of claim 1, wherein a fine delay cell code is switched after a coarse delay cell code is switched.

* * * * *